US012738462B2

(12) United States Patent
Ko

(10) Patent No.: US 12,738,462 B2
(45) Date of Patent: Sep. 15, 2026

(54) FOCUS RING, SUBSTRATE PROCESSING APPARATUS INCLUDING THE SAME, AND SEMICONDUCTOR FABRICATION METHOD USING THE SAME

(71) Applicant: SAMSUNG ELECTRONICS CO., LTD., Suwon-si (KR)

(72) Inventor: Hyungsik Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 18/211,887

(22) Filed: Jun. 20, 2023

(65) Prior Publication Data

US 2024/0021417 A1 Jan. 18, 2024

(30) Foreign Application Priority Data

| | | |
|---|---|---|
| Jul. 15, 2022 | (KR) | 10-2022-0087807 |
| Dec. 5, 2022 | (KR) | 10-2022-0167940 |
| Mar. 24, 2023 | (KR) | 10-2023-0038333 |

(51) Int. Cl.

| | |
|---|---|
| ***H01J 37/32*** | (2006.01) |
| ***H10P 72/72*** | (2026.01) |
| ***H10P 72/76*** | (2026.01) |

(52) U.S. Cl.

CPC ........ *H01J 37/32642* (2013.01); *H10P 72/72* (2026.01); *H10P 72/7612* (2026.01); *H10P 72/7624* (2026.01)

(58) Field of Classification Search

CPC ........... H01J 37/32642; H01L 21/6831; H01L 21/68742; H01L 21/68785; H10P 72/72; H10P 72/7612; H10P 72/7624

(Continued)

(56) References Cited

U.S. PATENT DOCUMENTS

| | | | |
|---|---|---|---|
| 6,277,198 B1 | 8/2001 | Yao et al. | |
| 8,114,247 B2 | 2/2012 | Endoh et al. | |

(Continued)

FOREIGN PATENT DOCUMENTS

| | | | |
|---|---|---|---|
| CN | 102017122 A * | 4/2011 | ......... C23C 16/4585 |
| CN | 104465450 A | 3/2015 | |

(Continued)

OTHER PUBLICATIONS

Machine Translation of CN-113308681-A (Year: 2021).*
Machine Translation of CN-102017122-A (Year: 2011).*
Machine Translation of CN-111192811-A (Year: 2020).*

*Primary Examiner* — Rodney G McDonald
(74) *Attorney, Agent, or Firm* — Sughrue Mion, PLLC

(57) ABSTRACT

A substrate processing apparatus includes a focus ring, the focus ring includes a central axis that extends in a first direction, a top surface having a first inner diameter, a bottom surface having a second inner diameter that is smaller than the first inner diameter, and an inner lateral surface between the top surface and the bottom surface, the inner lateral surface including a first inner lateral surface and a second inner lateral surface, where the second inner lateral surface extends downward from the first inner lateral surface and a first angle between the first inner lateral surface and a line corresponding to the first direction is different from a second angle between the second inner lateral surface and the line corresponding to the first direction.

19 Claims, 21 Drawing Sheets

(58) Field of Classification Search
USPC ...... 118/715, 719, 718, 720, 721; 156/345.3
See application file for complete search history.

(56) References Cited

U.S. PATENT DOCUMENTS

| | | | |
|---|---|---|---|
| 8,342,119 | B2 | 1/2013 | Yudovsky et al. |
| 8,854,790 | B1 | 10/2014 | Hsieh |
| 10,991,614 | B2 | 4/2021 | Schauer |
| 11,398,397 | B2 | 7/2022 | Lee et al. |
| 11,676,800 | B2 | 6/2023 | Tanaka et al. |
| 2007/0215279 | A1 | 9/2007 | Koshiishi |
| 2009/0260982 | A1 | 10/2009 | Riker et al. |
| 2015/0179412 | A1 | 6/2015 | Chhatre et al. |
| 2015/0187542 | A1 | 7/2015 | Ishida |
| 2021/0020412 | A1 | 1/2021 | Kim et al. |
| 2021/0090935 | A1 | 3/2021 | Koai et al. |

FOREIGN PATENT DOCUMENTS

| | | | | | |
|---|---|---|---|---|---|
| CN | 111192811 | A | * | 5/2020 | ........ H01J 37/32715 |
| CN | 113308681 | A | * | 8/2021 | .......... H01J 37/3244 |
| JP | 2012-15514 | A | | 1/2012 | |
| JP | 2012-146742 | A | | 8/2012 | |
| JP | 2019-169699 | A | | 10/2019 | |
| JP | 2021-168370 | A | | 10/2021 | |
| KR | 10-2006-0110705 | A | | 10/2006 | |
| KR | 10-2006-0116378 | A | | 11/2006 | |
| KR | 10-1235151 | B1 | | 2/2013 | |
| KR | 10-2013-0095873 | A | | 8/2013 | |
| KR | 10-2015-0073123 | A | | 6/2015 | |
| KR | 10-2016-0088820 | A | | 7/2016 | |
| KR | 10-2253990 | B1 | | 5/2021 | |
| TW | 202145340 | A | | 12/2021 | |

* cited by examiner

FOCUS RING, SUBSTRATE PROCESSING APPARATUS INCLUDING THE SAME, AND SEMICONDUCTOR FABRICATION METHOD USING THE SAME

CROSS-REFERENCE TO RELATED APPLICATIONS

This application is based on and claims priority to Korean Patent Applications No. 10-2022-0087807 filed on Jul. 15, 2022, Korean Patent Application No. 10-2022-0167940 filed on Dec. 5, 2022, and Korean Patent Application No. 10-2023-0038333 filed on Mar. 24, 2023, in the Korean Intellectual Property Office, the disclosures of which are incorporated herein by reference in their entireties.

BACKGROUND

1. Field

The disclosure relate to a focus ring, a substrate processing apparatus including the same, and a semiconductor fabrication method using the same, and more particularly, to a focus ring capable of being aligned with an electrostatic chuck structure, a substrate processing apparatus including the same, and a semiconductor fabrication method using the same.

2. Description of Related Art

A semiconductor device may be fabricated by using various processes. For example, a semiconductor device may be manufactured by allowing a silicon wafer to undergo a photolithography process, an etching process, a deposition process, and so forth. Plasma may be used in an etching process for fabricating a semiconductor device. A focus ring may be employed to control distribution of the plasma in a wafer etching process using the plasma.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided are a focus ring with central axis that is aligned to improve deviation of a substrate, a substrate processing apparatus including the same, and a semiconductor fabrication method using the same.

Additional aspects will be set forth in part in the description which follows and, in part, will be apparent from the description, or may be learned by practice of the presented embodiments.

According to an aspect of an example embodiment, a substrate processing apparatus may include a focus ring, the focus ring may include a central axis that extends in a first direction, a top surface having a first inner diameter, a bottom surface having a second inner diameter that is smaller than the first inner diameter, and an inner lateral surface between the top surface and the bottom surface, the inner lateral surface including a first inner lateral surface and a second inner lateral surface, where the second inner lateral surface may extend downward from the first inner lateral surface and a first angle between the first inner lateral surface and a line corresponding to the first direction may be different from a second angle between the second inner lateral surface and the line corresponding to the first direction.

According to an aspect of an example embodiment, a substrate processing apparatus may include an electrostatic chuck structure including a chuck that supports a substrate and a focus ring on a lateral surface of the chuck and having a central axis that extends in a first direction, where a top surface of the focus ring may have a first inner diameter, a bottom surface of the focus ring may have a second inner diameter, the first inner diameter may be smaller than the second inner diameter, and a diameter of the chuck may be in a range of about 298.6 mm to about 300 mm.

According to an aspect of an example embodiment, a substrate processing apparatus may include an electrostatic chuck structure, a focus ring on the electrostatic chuck structure and having a central axis that extends in a first direction, and an outer ring that at least partially surrounds the focus ring, where an inner lateral surface of the focus ring may include a first inner lateral surface and a second inner lateral surface, the second inner lateral surface may contact the first inner lateral surface, and the first inner lateral surface may be closer to the electrostatic chuck structure than the second inner lateral surface.

According to an aspect of the disclosure, a semiconductor fabrication method may include loading a substrate on an electrostatic chuck structure, performing a semiconductor process, removing the substrate from the electrostatic chuck structure, and replacing a focus ring, where the focus ring may have a central axis that extends in a first direction, an inner lateral surface of the focus ring may include a first inner lateral surface and a second inner lateral surface that extends from the first inner lateral surface, and in the replacing of the focus ring, at least a portion of the second inner lateral surface of the focus ring may contact the electrostatic chuck structure and a center of the electrostatic chuck structure and the central axis of the focus ring may align with each other.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
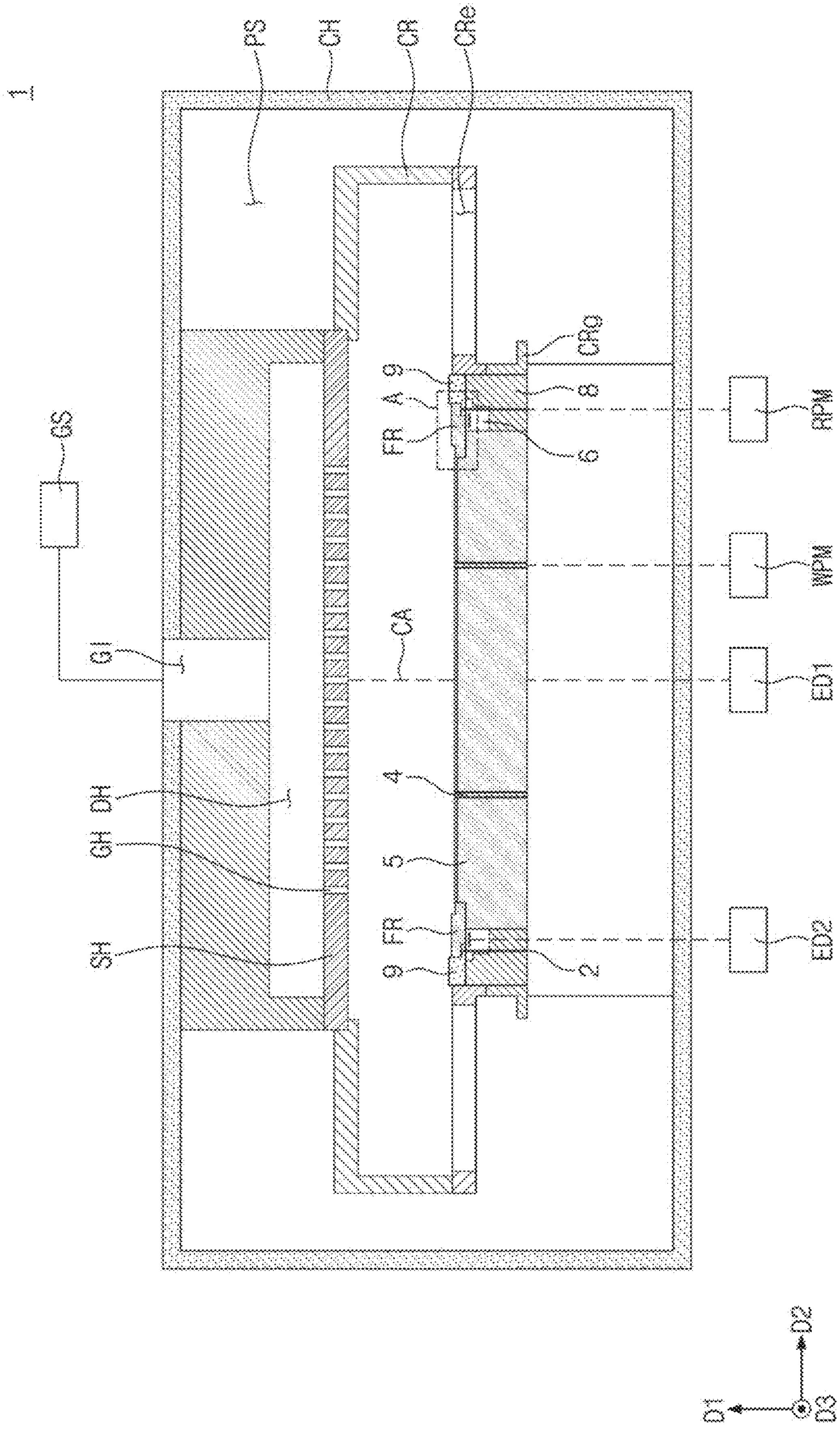
FIG. 1 is a cross-sectional view showing a substrate processing apparatus according to some embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a cross-sectional view showing a substrate processing apparatus according to some embodiments of the disclosure.

Referring to FIG. 1, a substrate processing apparatus 1 may be provided. The substrate processing apparatus 1 may be a facility to perform a semiconductor process on a substrate. For example, the semiconductor process may be an etching process, a deposition process, an ion implantation process, a cleaning process, and a photolithography process, and for example, may be an etching process.

The substrate processing apparatus 1 may be a device in which plasma is used to etch one surface of a substrate. The substrate processing apparatus 1 may generate plasma in various ways. For example, the substrate processing apparatus 1 may generate plasma by using a capacitively coupled plasma (CCP), inductively coupled plasma (ICP), or magnetically enhanced RIE (MERLE) mode. The disclosure, however, is not limited thereto. For example, the substrate processing apparatus 1 may use plasma to clean a substrate. For another example, the substrate processing apparatus 1 may not use plasma.

For convenience of description, the following description pertains to the substrate processing apparatus 1 configured to use the CCP mode to produce plasma.

The substrate processing apparatus 1 may include a process chamber CH, a gas supply GS, a ring lift pin mechanism RPM, a substrate lift pin mechanism WPM, a first radio-frequency (RF) power supply ED1, and a second radio-frequency (RF) power supply ED2.

The process chamber CH may include a showerhead SH, an electrostatic chuck structure 5, a confinement ring CR, a focus ring FR, a coupling ring 6, a ground ring 8, an outer ring 9, a substrate lift pin 4, and a ring lift pin 2. The process chamber CH may provide a process space PS. For example, the process space PS may accommodate the showerhead SH, the electrostatic chuck structure 5, the confinement ring CR, the focus ring FR, the ground ring 8, the outer ring 9, the substrate lift pin 4, and the ring lift pin 2.

The gas supply GS may be positioned outside and connected to the process chamber CH. For example, the gas supply GS may be connected through a gas inlet GI to the process space PS. For example, the gas supply GS may supply the process space PS through the gas inlet GI with a process gas which may be plasma. The gas supply GS may further include a gas tank and a compressor.

The showerhead SH may be positioned in an upper portion of the process chamber CH. A distribution space DH may be provided on the showerhead SH. The distribution space DH may be connected to the gas supply GS through the gas inlet GI. The showerhead SH may provide distribution holes GH. In a plan view, the distribution holes GH may be disposed along a second direction D2 and a third direction D3. Thus, a process gas supplied from the gas supply GS may be uniformly supplied through the distribution holes GH onto the electrostatic chuck structure 5. The showerhead SH may have a plane shape on a bottom surface thereof, but the disclosure is not limited thereto.

The confinement ring CR may surround or at least partially surround a space between the showerhead SH and the electrostatic chuck structure 5. The confinement ring CR may provide a slit CRe. The confinement ring CR may include a plurality of slits CRe. In a plan view, the plurality of slits CRe may be provided at a regular interval. Thus, a process gas supplied from the gas supply GS may be uniformly discharged through the plurality of slits CRe. The confinement ring CR may include a ground member CRg, and may be grounded through the ground member CRg.

The electrostatic chuck structure 5 may be positioned in a center of the process chamber CH. A substrate may be disposed on the electrostatic chuck structure 5. The electrostatic chuck structure 5 may support and/or fix a substrate. For example, when a substrate is disposed on the electrostatic chuck structure 5, the electrostatic chuck structure 5 may use an electrostatic force to rigidly place a substrate on a fixed position. The electrostatic chuck structure 5 may be provided on its lateral surface with the coupling ring 6, the ground ring 8, and the outer ring 9. For example, the electrostatic chuck structure 5 may be surrounded by or at least partially surrounded by each of the coupling ring 6, the ground ring 8, and the outer ring 9.

The focus ring FR may be positioned on the electrostatic chuck structure 5, and may surround or at least partially surround a substrate disposed on the electrostatic chuck structure 5. The focus ring FR may be a body of rotation about a central axis CA. The central axis CA of the focus ring FR may extend in a first direction D1. For example, the focus ring FR may include silicon (Si) and/or silicon carbide (SiC), but the disclosure is not limited thereto. The focus ring FR may include, for example, quartz and/or boron carbide (B4C). The focus ring FR may be separated into two or more members. The two or more members of the focus ring FR may include materials that are different from each other.

The coupling ring 6 may be positioned below the focus ring FR, and may be a body of rotation about the central axis CA. For example, the coupling ring 6 may be positioned between the focus ring FR and the ground ring 8 which will be described below, and may surround or at least partially surround the electrostatic chuck structure 5. For example, in a plan view, the coupling ring 6 may surround or at least partially surround an outer circumference of the electrostatic chuck structure 5. The coupling ring 6 may include alumina ($Al_2O_3$).

The ground ring 8 and the outer ring 9 may surround or at least partially surround the electrostatic chuck structure 5. The ground ring 8 and the outer ring 9 may each be a body of rotation about the central axis CA. For example, the coupling ring 6 may be positioned on the ground ring 8. The outer ring 9 may surround or at least partially surround the focus ring FR, while being positioned on the ground ring 8 and the coupling ring 6. The outer ring 9 may include a different material from that of the focus ring FR, but the disclosure is not limited thereto.

The substrate lift pin 4 may extend in the first direction D1. The substrate lift pin 4 may vertically penetrate the electrostatic chuck structure 5. For example, the substrate lift pin 4 may be provided in the electrostatic chuck structure 5. The substrate lift pin 4 may be connected to the substrate lift pin mechanism WPM. The substrate lift pin 4 may be vertically movable by the substrate lift pin mechanism WPM. The substrate lift pin 4 may vertically move to load and/or unload a substrate on and/or from the electrostatic chuck structure 5. A plurality of substrate lift pins 4 may be included. For example, three substrate lift pins 4 may be provided, but the disclosure is not limited thereto. The plurality of substrate lift pins 4 may be spaced apart from each other in a horizontal direction. A single substrate lift pin 4 will be described below in convenience.

The ring lift pin 2 may extend in the first direction D1. The ring lift pin 2 may be positioned outside the electrostatic chuck structure 5. The ring lift pin 2 may vertically penetrate the coupling ring 6, the ground ring 8, and the outer ring 9. For example, the ring lift pin 2 may be provided in the coupling ring 6, the ground ring 8, and the outer ring 9. The ring lift pin 2 may be vertically movable by the ring lift pin mechanism RPM. The ring lift pin 2 may vertically move to load and/or unload the focus ring FR. The ring lift pin 2 may be provided in plural. For example, three ring lift pins 2 may be provided, but the disclosure is not limited thereto. The plurality of ring lift pins 2 may be spaced apart from each other in a horizontal direction. A single ring lift pin 2 will be described below.

The substrate lift pin mechanism WPM and the ring lift pin mechanism RPM may vertically move the substrate lift pin 4 and the ring lift pin 2, respectively. For example, each of the substrate lift pin mechanism WPM and the ring lift pin mechanism RPM may include an actuator, such as an electric motor and/or a hydraulic motor. It is depicted that the substrate lift pin mechanism WPM and the ring lift pin mechanism RPM are positioned outside the process chamber CH, but the disclosure is not limited thereto.

The first RF power supply ED1 may be electrically connected to the electrostatic chuck structure 5. The first RF power supply ED1 may provide the electrostatic chuck structure 5 with a first RF power. The second RF power supply ED2 may be externally electrically connected to the electrostatic chuck structure 5. The second RF power supply ED2 may externally provide the electrostatic chuck structure 5 with a second RF power. The second RF power may be differentiated from the first RF power. For example, a frequency of the first RF power may be different from that of the second RF power. The first RF power and the second RF power may be or not be supplied at the same time.

Figure 2:
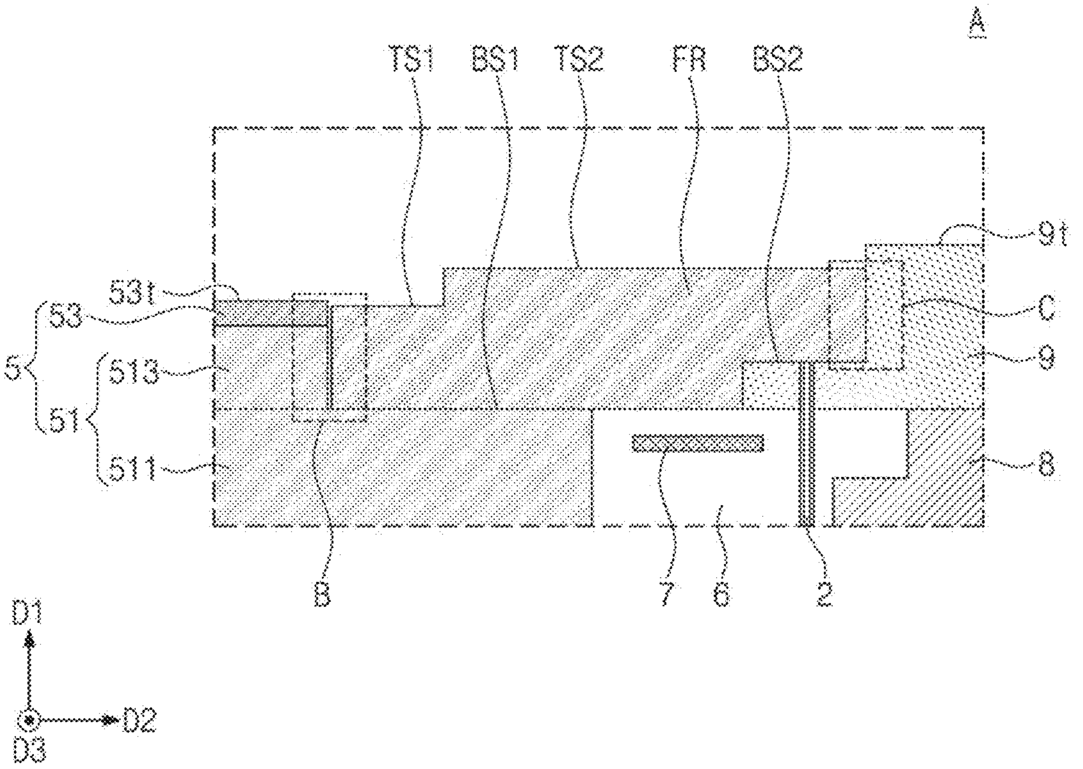
FIG. 2 is an enlarged view of section A depicted in FIG. 1, showing an electrostatic chuck, a focus ring, and an outer ring according to some embodiments of the disclosure.

FIG. 2 is an enlarged view of section A depicted in FIG. 1, showing an electrostatic chuck, a focus ring, and an outer ring according to some embodiments of the disclosure.

In FIG. 2, a description of components the same as those described with reference to FIG. 1 may be omitted.

Referring to FIG. 2, the electrostatic chuck structure 5 may include a plasma electrode 51 and a chuck 53. The plasma electrode 51 may include an electrode body 511 and a plateau 513.

The chuck 53 may be positioned on the plasma electrode 51. The plasma electrode 51 may support the chuck 53. The plasma electrode 51 and the chuck 53 may each have a cylindrical shape. The plasma electrode 51 may be connected to the first RF power supply ED1. The plasma electrode 51 may be supplied with the first RF power from the first RF power supply ED1. The plasma electrode 51 may include a conductive material. For example, the plasma electrode 51 may include aluminum (Al). When the substrate processing apparatus (see 1 of FIG. 1) is a CCP device, the plasma electrode 51 may be a lower electrode. In addition, the showerhead (see SH of FIG. 1) may be an upper electrode.

The plateau 513 may be positioned on the electrode body 511. The electrode body 511 and the plateau 513 may each have a cylindrical shape. A diameter of the plateau 513 may be smaller than that of the electrode body 511. For example, a top surface of the electrode body 511 may be partially exposed to the outside. The focus ring FR may be positioned on the exposed top surface of the electrode body 511. For example, the electrode body 511 may support a portion of the focus ring FR. The top surface of the electrode body 511 may be located at the same level as that of a first bottom surface BS1 of the focus ring FR.

The chuck 53 may be positioned on the plasma electrode 51. A substrate may be provided on a top surface 53*t* of the chuck 53. For example, the chuck 53 may support and fix a substrate, while contacting the substrate. The chuck 53 may be provided on its top surface 53*t* with a plurality of burl structures for supporting a substrate. The chuck 53 may include an electrode. The electrode may use an electrostatic force to rigidly place a substrate on a fixed position on the chuck 53.

The coupling ring 6 may include an outer electrode 7. The outer electrode 7 may be positioned below the focus ring FR and in the coupling ring 6. The outer electrode 7 may be spaced part from the ring lift pin 2. The outer electrode 7 may include tungsten (W) and/or platinum (Pt). The outer electrode 7 may be electrically connected to the second RF power supply ED2 of FIG. 1. The outer electrode 7 may be supplied with the second RF power from the second RF power supply ED2.

The focus ring FR may have a step difference on top and bottom surfaces thereof. For example, the top surface of the focus ring FR may include a first top surface TS1 and a second top surface TS2 that are located at different levels. The bottom surface of the focus ring FR may include a first bottom surface BS1 and a second bottom surface BS2 that are located at different levels. The first top surface TS1 may be located at a lower level than that of the second top surface TS2. The first bottom surface BS1 may be located at a lower level than that of the second bottom surface BS2. An inner lateral surface of the focus ring FR may be positioned between the first top surface TS1 and the first bottom surface BS1. An outer lateral surface of the focus ring FR may be positioned between the second top surface TS2 and the second bottom surface BS2. In the description, the term "level" may denote a height in the first direction D1.

The focus ring FR may be positioned on the electrostatic chuck structure 5, the coupling ring 6, and the outer ring 9. For example, the first bottom surface BS1 of the focus ring FR may be located at the same level as that of the exposed top surface of the electrode body 511 and that of a top surface of the coupling ring 6. The second bottom surface BS2 of the focus ring FR may be positioned on a portion of the outer ring 9.

The first top surface TS1 of the focus ring FR may be located at a lower level than that of the top surface 53*t* of the chuck 53. Thus, when a substrate is positioned on the electrostatic chuck structure 5, the substrate may not contact the first top surface TS1 of the focus ring FR. The second top surface TS2 of the focus ring FR may be located at a lower level than that of a top surface 9*t* of the outer ring 9. The disclosure, however, is not limited thereto. For example, the first top surface TS1 of the focus ring FR may be located at a level the same as or higher than that of the top surface 53*t* of the chuck 53. The second top surface TS2 of the focus ring FR may be located at a level the same as or higher than that of the top surface 9*t* of the outer ring 9.

A thermal pad may be positioned between the electrostatic chuck structure 5 and the focus ring FR. The thermal pad may serve as an adhesive while transferring temperature. For example, the thermal pad may transfer a temperature of the electrostatic chuck structure 5 to the focus ring FR, and may hold the focus ring FR to be immovable or substantially stationary. For example, the thermal pad may include a silicon-based material, a carbon nano-tube, and/or a filler such as aluminum (Al), but the disclosure is not limited thereto.

The ring lift pin 2 may be positioned below the focus ring FR. The ring lift pin 2 may contact the second bottom surface BS2 of the focus ring FR. The ring lift pin 2 may be positioned outside the outer electrode 7. In a plan view, the ring lift pin 2 may not overlap the outer electrode 7. The ring lift pin 2 may vertically penetrate the coupling ring 6, the ground ring 8, and the outer ring 9. For example, the coupling ring 6, the ground ring 8, and the outer ring 9 may provide a pin insertion hole (not designated by a reference numeral). The ring lift pin 2 may be positioned and vertically movable in the pin insertion hole.

Figure 3:
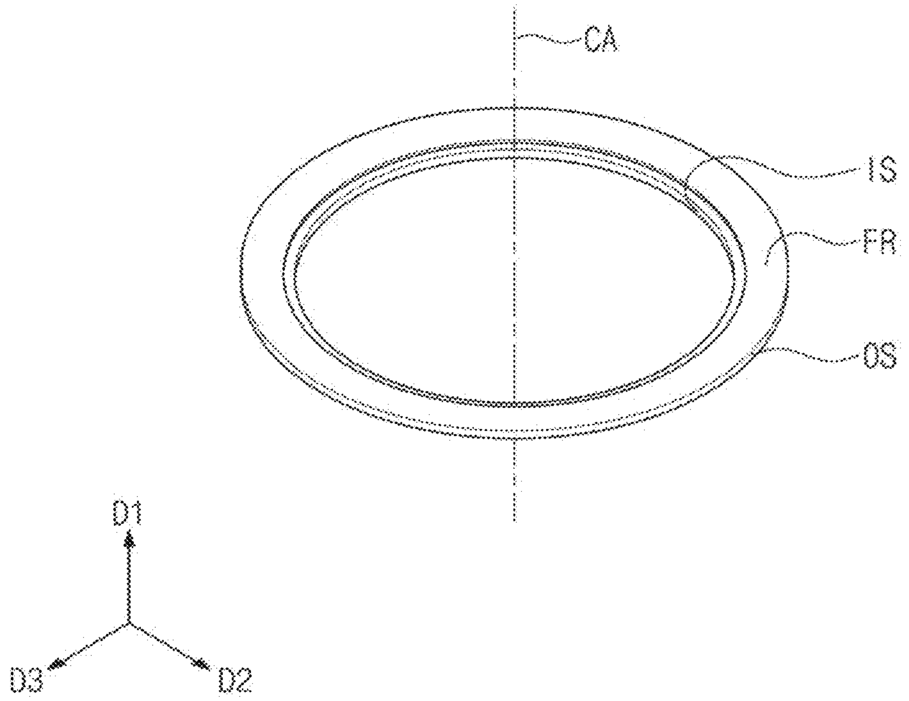
FIG. 3 is a diagram showing a focus ring according to some embodiments of the disclosure.
Figure 4:
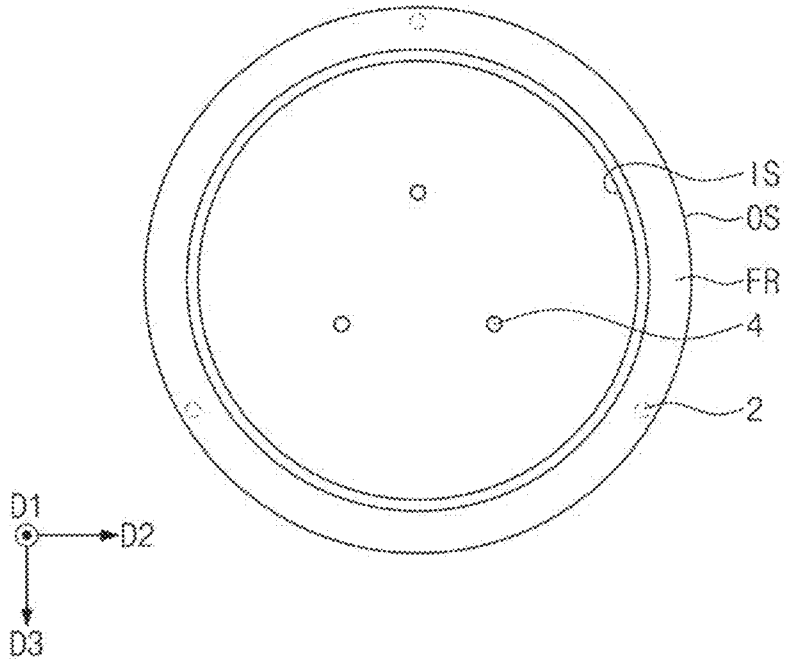
FIG. 4 is a plan view showing a focus ring according to some embodiments of the disclosure.

FIG. 3 is a diagram showing a focus ring according to some embodiments of the disclosure. FIG. 4 is a plan view showing a focus ring according to some embodiments of the disclosure.

Referring to FIGS. 3 and 4, the focus ring FR may be a body of rotation having the central axis CA that extends in the first direction D1. The inner lateral surface of the focus ring FR may be directed toward the central axis CA. The inner lateral surface of the focus ring FR may define a space through which the central axis CA passes. The outer lateral surface of the focus ring FR may be directed in a direction away from the central axis CA. An inner diameter of the focus ring FR may indicate a distance between the inner lateral surface of the focus ring FR, while passing through the central axis CA. An outer diameter of the focus ring FR may indicate a distance between the outer lateral surface of the focus ring FR, while passing through the central axis CA. For example, a distance between the central axis CA and the inner lateral surface of the focus ring FR may be about half the inner diameter of the focus ring FR. A distance between the central axis CA and the outer lateral surface of the focus ring FR may be about half the outer diameter of the focus ring FR.

The substrate lift pin 4 may be positioned in a space through which the central axis CA passes. In a plan view, the substrate lift pin 4 may not overlap the focus ring FR. Three substrate lift pins 4 may be provided. The three substrate lift pins 4 may form three vertices of a triangle. In this configuration, an angle of about 120° may be formed between two adjacent ones of the three substrate lift pins 4.

The ring lift pin 2 may be positioned below the focus ring FR. For example, the ring lift pin 2 may be positioned closer to the outer lateral surface of the focus ring FR than to the inner lateral surface of the focus ring FR. Three ring lift pins 2 may be provided. The three ring lift pins 2 may form three vertices of a triangle. In this configuration, an angle of about 120° may be formed between two adjacent ones of the three ring lift pins 2. Thus, an arrangement of the three ring lift pins 2 may be similar to that of the three substrate lift pins 4.

The disclosure, however, is not limited thereto. For example, there may be variation in the number of the substrate lift pins 4 and the angle between the substrate lift pins 4. In addition, there may be much variation in the number of the ring lift pins 2 and the angle between the ring lift pins 2. Therefore, the substrate lift pin 4 and the ring lift pin 2 may be different from each other in terms of arrangement.

FIGS. 5, 6, 7, 8 and 9 are enlarged views of section B depicted in FIG. 2, showing an electrostatic chuck structure and a focus ring according to some embodiments of the disclosure.

In the description of FIGS. 5-9, a description of components the same as those described with reference to FIGS. 1 and 2 may be omitted.

Figure 5:
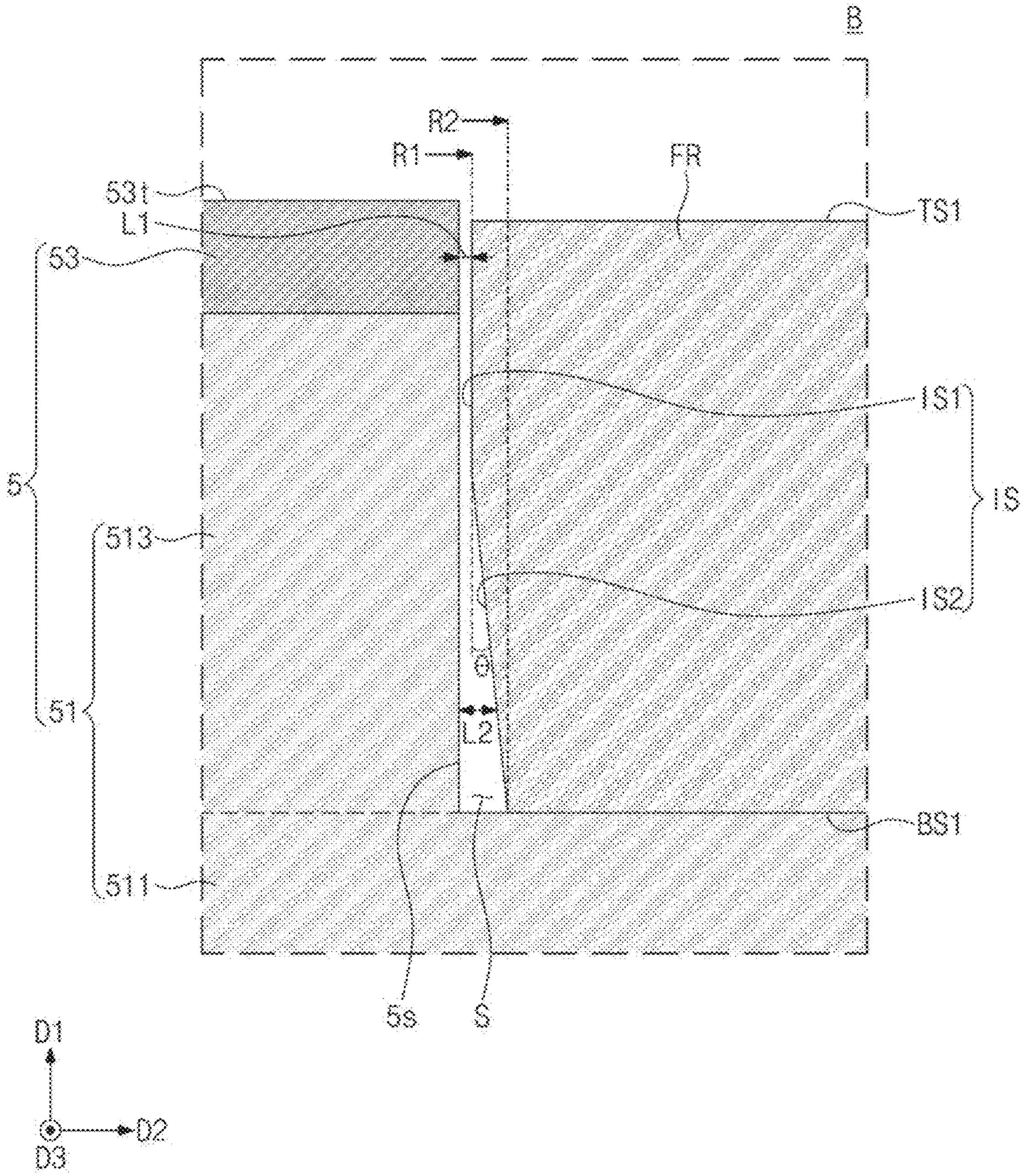
FIGS. 5, 6, 7, 8 and 9 are enlarged views of section B depicted in FIG. 2, showing an electrostatic chuck structure and a focus ring according to some embodiments of the disclosure.

Referring to FIG. 5, the focus ring FR may have an inner lateral surface IS positioned between the first top surface TS1 and the first bottom surface BS1. The inner lateral surface IS of the focus ring FR may include a first inner lateral surface IS1 and a second inner lateral surface IS2.

The first inner lateral surface IS1 may be perpendicular to the first top surface TS1. Thus, an angle of about 90° may be formed between the first inner lateral surface IS1 and the first top surface TS1. For example, the first inner lateral surface IS1 may be parallel to the first direction D1, and an angle of about 0° may be formed between the first inner lateral surface IS1 and the first direction D1.

The second inner lateral surface IS2 may extend from the first inner lateral surface IS1. For example, the second inner lateral surface IS2 may contact the first inner lateral surface IS1 and be positioned between the first inner lateral surface IS1 and the first bottom surface BS1. The first inner lateral surface IS1 and the second inner lateral surface IS2 may share a circumference of one circle at a contact point therebetween. The second inner lateral surface IS2 may make an angle θ with the first direction D1 (as described herein, an angle being formed with respect to the first direction D1 may indicate an angle being formed with respect to a line (arbitrary or otherwise) corresponding to the first direction DD. For example, the angle θ between the second inner lateral surface IS2 and the first direction D1 may be different from an angle between the first inner lateral surface IS1 and the first direction D1. The second inner lateral surface IS2 may not be parallel to the first direction D1. The second inner lateral surface IS2 may not be perpendicular to the first top surface TS1 or the first bottom surface BS1. An acute angle may be given as the angle θ between the second inner lateral surface IS2 and the first direction D1. For example, the angle θ between the second inner lateral surface IS2 and the first direction D1 may be greater than about 0° and equal to or smaller than about 5°, but the disclosure is not limited thereto.

The first top surface TS1 may have a first inner diameter R1. The first bottom surface BS1 may have a second inner diameter R2. The first inner diameter R1 may be smaller than the second inner diameter R2. For example, the second inner diameter R2 of the focus ring FR may be greater than the first inner diameter R1 of the focus ring FR, such that the distance from the central axis CA of the focus ring FR to a surface corresponding to the first inner diameter R1 is smaller than a distance from the central axis CA of the focus ring FR to a surface corresponding to the second inner diameter R2. The first top surface TS1 may be closer than the first bottom surface BS1 to the electrostatic chuck structure 5. For example, a difference between the first inner diameter R1 and the second inner diameter R2 may range from about 0.01 mm to about 0.5 mm, but the disclosure is not limited thereto.

A first distance L1 may be defined to indicate a distance between the first inner lateral surface IS1 and a lateral surface 5*s* of the electrostatic chuck structure 5. A distance between the second inner lateral surface IS2 and the lateral surface 5*s* of the electrostatic chuck structure 5 may increase in a direction from the first top surface TS1 toward the first bottom surface BS1. A second distance L2 may be defined to indicate an average distance between the second inner lateral surface IS2 and the lateral surface 5*s* of the electrostatic chuck structure 5. The first distance L1 may be smaller than the second distance L2. For example, the first inner lateral surface IS1 may be closer than the second inner lateral surface IS2 to the lateral surface 5*s* of the electrostatic chuck structure 5. A spare space S may be provided between the second inner lateral surface IS2 and the lateral surface 5*s* of the electrostatic chuck structure 5.

Figure 6:
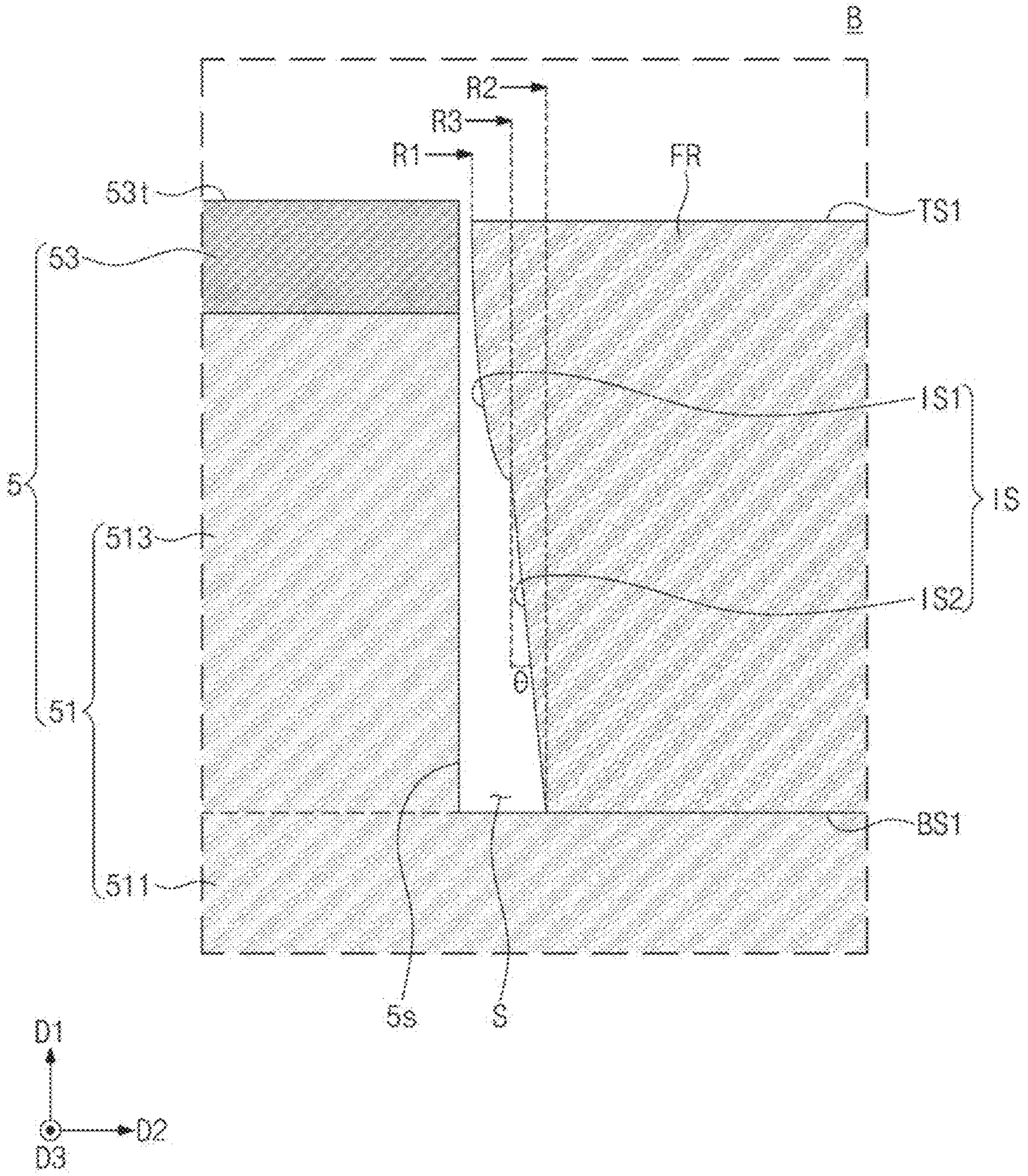

Referring to FIG. 6, the first inner lateral surface IS1 may have a shape that is convex toward the lateral surface 5*s* of the electrostatic chuck structure 5. For example, the first inner lateral surface IS1 may have a shape that is convex toward the central axis CA of FIG. 3. A distance between the first inner lateral surface IS1 and the lateral surface 5*s* of the electrostatic chuck structure 5 may increase in a direction from the first top surface TS1 toward the first bottom surface BS1.

The second inner lateral surface IS2 may downwardly extend from the first inner lateral surface IS1, and an angle θ may be formed between the second inner lateral surface IS2 and the first direction D1. For example, the second inner lateral surface IS2 may not be parallel to the first direction D1. Therefore, the angle θ between the second inner lateral surface IS2 and the first direction D1 may be different from an angle between the first inner lateral surface IS1 and the first direction D1. An acute angle may be given as the angle θ between the second inner lateral surface IS2 and the first direction D1. For example, the angle θ between the second inner lateral surface IS2 and the first direction D1 may be greater than about 0° and equal to or smaller than about 5°, but the disclosure is not limited thereto.

A point where the first inner lateral surface IS1 and the second inner lateral surface IS2 contact each other may have a third inner diameter R3. The third inner diameter R3 may be greater than the first inner diameter R1 (i.e., greater in distance from the central axis CA of the focus ring FR). The third inner diameter R3 may be smaller than the second inner diameter R2. For example, the third inner diameter R3 may be positioned between the first inner diameter R1 and the second inner diameter R2.

Alternatively, the second inner lateral surface IS2 may be parallel to the first direction D1. For example, an angle of about 0° may be formed between the second inner lateral surface IS2 and the first direction D1. In this case, the second inner diameter R2 may be substantially the same as the third inner diameter R3.

Figure 7:
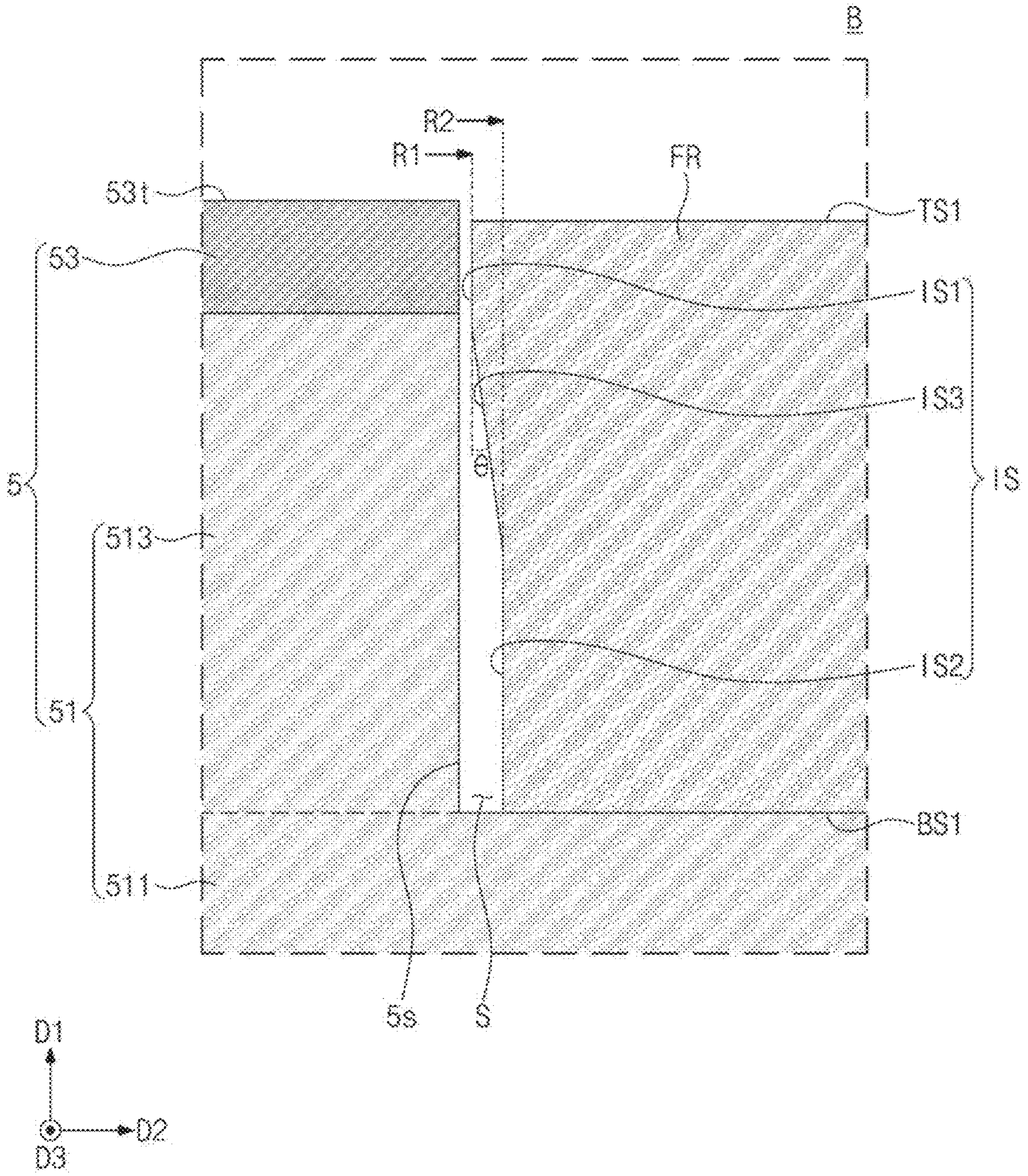

Referring to FIG. 7, the inner lateral surface IS of the focus ring FR may further include a third inner lateral surface IS3. The third inner lateral surface IS3 may be positioned between the first inner lateral surface IS1 and the second inner lateral surface IS2. For example, the third inner lateral surface IS3 may downwardly extend from the first inner lateral surface IS1, and the second inner lateral surface IS2 may downwardly extend from the third inner lateral surface IS3. The first inner lateral surface IS1 and the third inner lateral surface IS3 may share a circumference of one circle, and the third inner lateral surface IS3 and the second inner lateral surface IS2 may share a circumference of another one circle.

The first and second inner lateral surfaces IS1 and IS2 may be parallel to the first direction D1. For example, the first and second inner lateral surfaces IS1 and IS2 may be perpendicular to the first top surface TS1 or the first bottom surface BS1. The first inner lateral surface IS1 may be parallel to the second inner lateral surface IS2. An angle θ may be formed between the third inner lateral surface IS3 and the first direction D1. The third inner lateral surface IS3 may not be parallel to the first direction D1. An acute angle may be given as the angle θ between the third inner lateral surface IS3 and the first direction D1. For example, the angle θ between the third inner lateral surface IS3 and the first direction D1 may be greater than about 0° and equal to or smaller than about 5°. The disclosure, however, are not limited thereto. For example, the second inner lateral surface IS2 may not be parallel to the first direction D1, and an angle made between the second inner lateral surface IS2 and the first direction D1 may be different from that made between the third inner lateral surface IS3 and the first direction D1.

The first inner lateral surface IS1 may be closer than the second and third inner lateral surfaces IS2 and IS3 to the lateral surface 5*s* of the electrostatic chuck structure 5. The second inner lateral surface IS2 may be farther away than the first and third inner lateral surfaces IS1 and IS3 from the lateral surface 5*s* of the electrostatic chuck structure 5.

Figure 8:
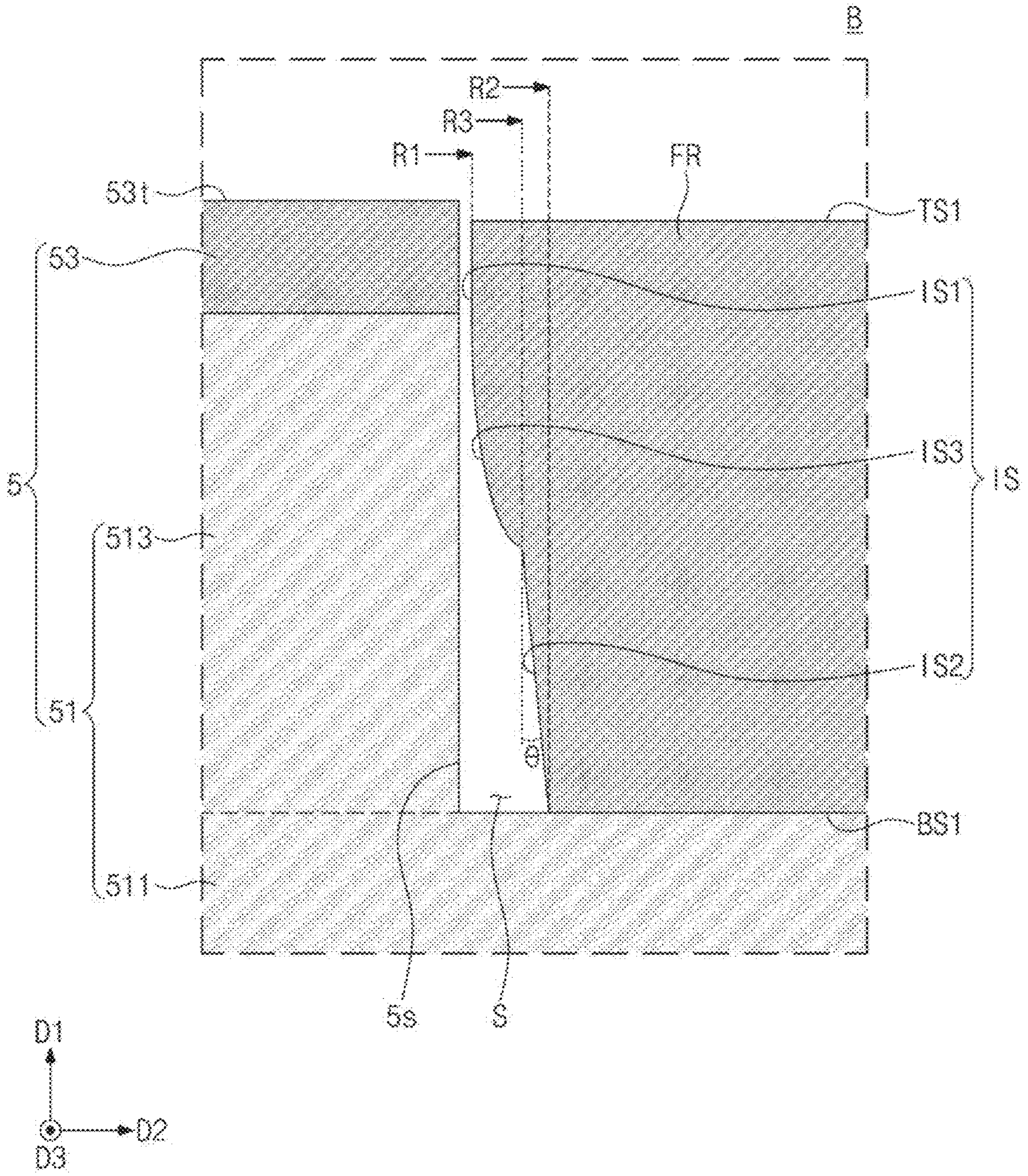

Referring to FIG. 8, the third inner lateral surface IS3 may have a shape that is convex toward the lateral surface 5*s* of the electrostatic chuck structure 5. For example, the third inner lateral surface IS3 may have a shape that is convex toward the central axis CA of FIG. 3. A distance between the third inner lateral surface IS3 and the lateral surface 5*s* of the electrostatic chuck structure 5 may increase in a direction from the first top surface TS1 toward the first bottom surface BS1.

An angle θ may be formed between the second inner lateral surface IS2 and the first direction D1. For example, the second inner lateral surface IS2 may not be parallel to the first direction D1. The angle θ between the second inner lateral surface IS2 and the first direction D1 may be different from an angle between the first inner lateral surface IS1 and the first direction D1. An acute angle may be given as the angle θ between the second inner lateral surface IS2 and the first direction D1. For example, the angle θ between the second inner lateral surface IS2 and the first direction D1 may be greater than about 0° and equal to or smaller than about 5°, but the disclosure is not limited thereto.

A point where the second inner lateral surface IS2 and the third inner lateral surface IS3 contact each other may have a third inner diameter R3. The third inner diameter R3 may be greater than the first inner diameter R1 and smaller than the second inner diameter R2.

Alternatively, the second inner lateral surface IS2 may be parallel to the first direction D1. For example, a zero degree may be given as the angle θ between the second inner lateral surface IS2 and the first direction D1. In this case, the third inner diameter R3 may be substantially the same as the second inner diameter R2.

Referring to FIGS. 5 to 8, the first inner diameter R1 may be smaller than the second inner diameter R2. The first top surface TS1 may be closer than the first bottom surface BS1 to the lateral surface 5s of the electrostatic chuck structure 5. In addition, the first inner lateral surface IS1 may be closer than the second inner lateral surface IS2 to the electrostatic chuck structure 5. A distance between the first inner lateral surface IS1 and the lateral surface 5s of the electrostatic chuck structure 5 may be smaller than that between the second inner lateral surface IS2 and the lateral surface 5s of the electrostatic chuck structure Because an upper portion of the focus ring FR is closer than a lower portion of the focus ring FR to the electrostatic chuck structure 5, the focus ring FR may be prevented from being biased in one direction of the electrostatic chuck structure 5. For example, the first inner lateral surface IS1 may serve as an auxiliary tool used for aligning the focus ring FR and the electrostatic chuck structure 5. Therefore, the focus ring FR of the disclosure may be configured to align its central axis CA with a center of the electrostatic chuck structure 5. Accordingly, in a semiconductor fabrication method which will be described below, plasma may be uniformly generated on a substrate and a deviation in properties of semiconductor devices in the substrate may be improved.

Moreover, the spare space S may be provided between the focus ring FR and the electrostatic chuck structure 5. For example, the spare space S may be provided between the second inner lateral surface IS2 and the lateral surface 5s of the electrostatic chuck structure 5. In a semiconductor fabrication method which will be described below, a semiconductor process may be performed at high temperatures, and thus the focus ring FR may experience thermal expansion during semiconductor fabrication process. The spare space S between the focus ring FR and the electrostatic chuck structure 5 may be a space in preparation for thermal expansion of the focus ring FR. Therefore, the focus ring FR may be prevented from being broken due to thermal expansion.

Furthermore, the first inner lateral surface IS1 may be perpendicular, or substantially perpendicular, to the first top surface TS1. For example, an angle of about 90° may be formed between the first inner lateral surface IS1 and the first top surface TS1. As an angle between the first inner lateral surface IS1 and the first top surface TS1 is not an acute angle equal to or smaller than about 60°, there may be no sharp point where the first top surface TS1 and the first inner lateral surface IS1 of the focus ring FR contact each other. Therefore, a cutting accident may be prevented by the focus ring FR, and no RF power may be concentrated to prevent an arcing phenomenon of the focus ring FR.

Figure 9:
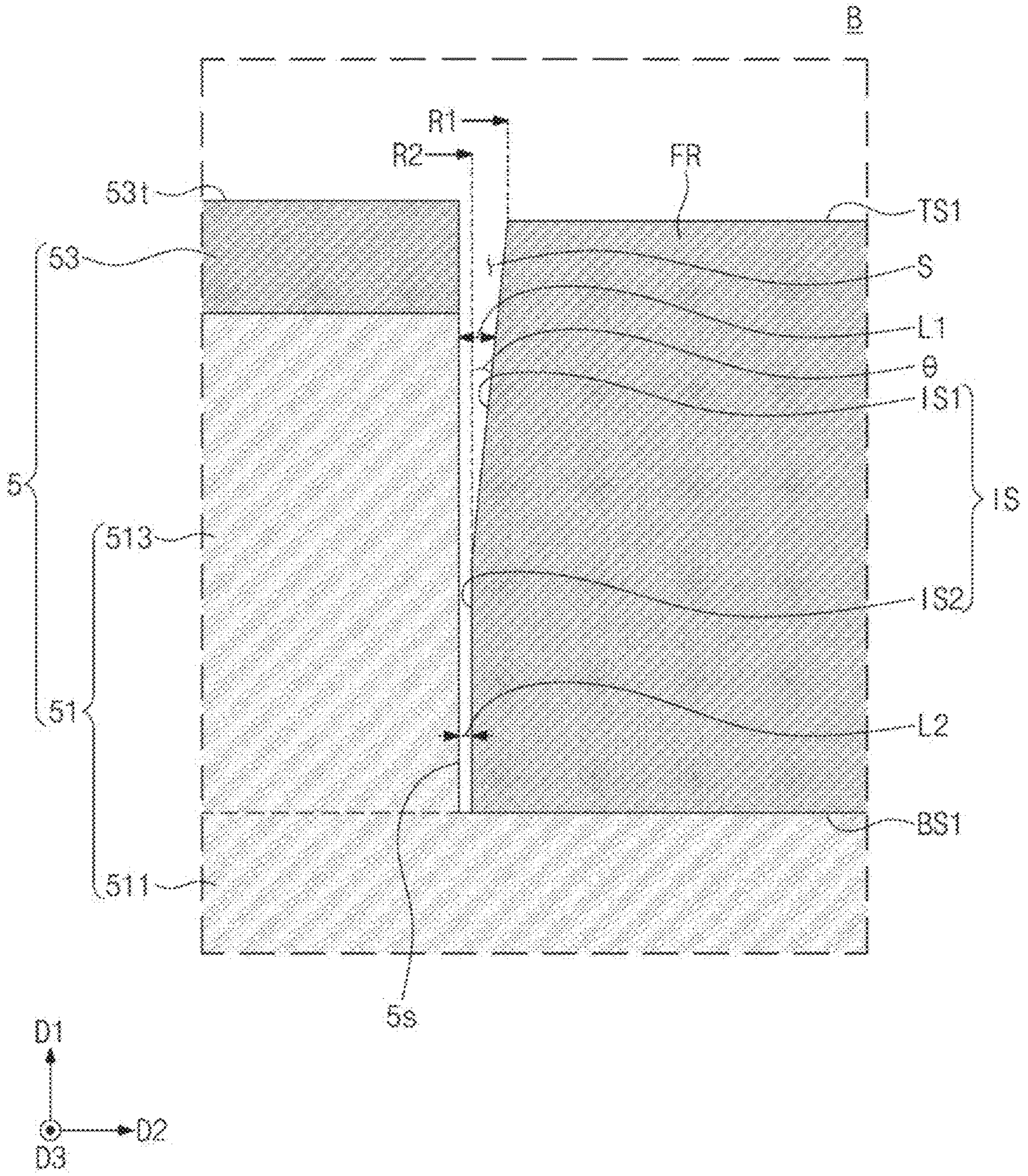

Referring to FIG. 9, the inner lateral surface IS of the focus ring FR may be positioned between the first top surface TS1 and the first bottom surface BS1, and may include a first inner lateral surface IS1 and a second inner lateral surface IS2. The second inner lateral surface IS2 may extend from the first inner lateral surface IS1, and the first inner lateral surface IS1 and the second inner lateral surface IS2 may share a circumference of one circle at a contact point therebetween.

An angle θ may be formed between the first inner lateral surface IS1 and the first direction D1. For example, the first inner lateral surface IS1 may not be parallel to the first direction D1. An acute angle may be given as the angle θ between the first inner lateral surface IS1 and the first direction D1. For example, the angle θ between the first inner lateral surface IS1 and the first direction D1 may be greater than about 0° and equal to or smaller than about 5°, but the disclosure is not limited thereto. Therefore, a distance between the first inner lateral surface IS1 and the lateral surface 5s of the electrostatic chuck structure 5 may decrease in a direction from the first top surface TS1 toward the first bottom surface BS1. A first distance L1 may be defined to indicate an average distance between the first inner lateral surface IS1 and a lateral surface 5s of the electrostatic chuck structure 5.

The second inner lateral surface IS2 may be parallel to the first inner lateral surface IS1. Therefore, a uniform distance may be provided between the second inner lateral surface IS2 and the lateral surface 5s of the electrostatic chuck structure 5. A second distance L2 may be defined to indicate the distance between the second inner lateral surface IS2 and the lateral surface 5s of the electrostatic chuck structure 5. The second distance L2 may be smaller than the first distance L1.

The first top surface TS1 may have a first inner diameter R1. The first bottom surface BS1 may have a second inner diameter R2. The first inner diameter R1 may be greater than the second inner diameter R2. For example, a difference between the first inner diameter R1 and the second inner diameter R2 may range from about 0.01 mm to about 0.5 mm.

The disclosure, however, is not limited thereto. There may be provided various examples of the focus ring FR whose first inner diameter R1 is greater than the second inner diameter R2 thereof. For example, at least one of the focus rings FR described in FIGS. 5 to 8 may have a vertically symmetric shape.

Figure 10:
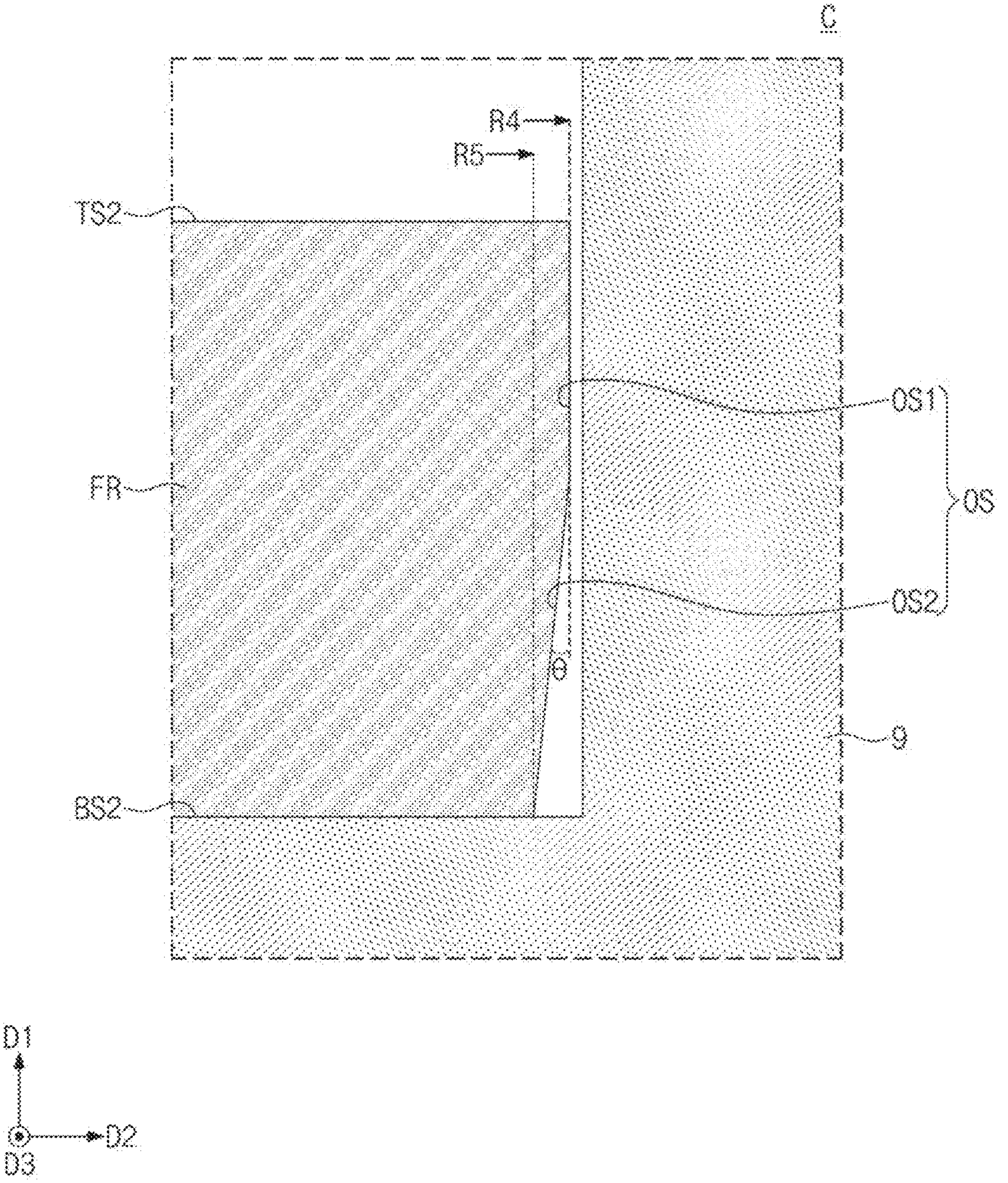
FIG. 10 is an enlarged view of section C depicted in FIG. 2, showing a focus ring according to some embodiments of the disclosure.

FIG. 10 is an enlarged view of section C depicted in FIG. 2, showing a focus ring according to some embodiments of the disclosure.

In the description of FIG. 10, a description of components the same as those described with reference to FIGS. 1 and 2 may be omitted.

Referring to FIG. 10, the focus ring FR may have an outer lateral surface OS positioned between the second top surface TS2 and the second bottom surface BS2. The outer lateral surface OS of the focus ring FR may include a first outer lateral surface OS1 and a second outer lateral surface OS2.

The first outer lateral surface OS1 may be perpendicular to the second top surface TS2 or the second bottom surface BS2. For example, an angle of about 90° may be formed between the first outer lateral surface OS1 and the second top surface TS2 or the second bottom surface BS2. In this configuration, the first outer lateral surface OS1 may be parallel to the first direction D1, and an angle of about 0° may be formed between the first outer lateral surface OS1 and the first direction D1. Therefore, a constant distance may be provided between the first outer lateral surface OS1 and a lateral surface of the outer ring 9.

The second outer lateral surface OS2 may downwardly extend from the first outer lateral surface OS1. For example, the second outer lateral surface OS2 may contact the first outer lateral surface OS1 and be positioned between the first outer lateral surface OS1 and the second bottom surface BS2. The first outer lateral surface OS1 and the second outer lateral surface OS2 may share a circumference of one circle at a contact point therebetween. An angle θ may be formed between the second outer lateral surface OS2 and the first direction D1. For example, the angle θ between the second outer lateral surface OS2 and the first direction D1 may be different from an angle between the first outer lateral surface OS1 and the first direction D1. The second outer lateral surface OS2 may not be parallel to the first direction D1. The second outer lateral surface OS2 may not be perpendicular to the second top surface TS2 or the second bottom surface BS2. Therefore, a distance between the second outer lateral surface OS2 and the outer ring 9 may increase in a downward direction. An acute angle may be given as the angle θ between the second outer lateral surface OS2 and the first direction D1. For example, the angle θ between the second outer lateral surface OS2 and the first direction D1 may be greater than about 0° and equal to or smaller than about 5°, but the disclosure is not limited thereto.

The second top surface TS2 may have a first outer diameter R4. The second bottom surface BS2 may have a second outer diameter R5. The first outer diameter R4 may be greater than the second outer diameter R5. The second top surface TS2 may be closer than the second bottom surface BS2 to the outer ring 9. For example, the first outer lateral surface OS1 may be closer than the second outer lateral surface OS2 to the outer ring 9.

The disclosure, however, is not limited thereto. There may be variation in shape of the outer lateral surface OS of the focus ring FR according to the disclosure. For example, the outer lateral surface OS of the focus ring FR may have a shape laterally symmetrical to that of the inner lateral surface IS of the focus ring FR described in FIGS. 5 to 8.

Figure 11:
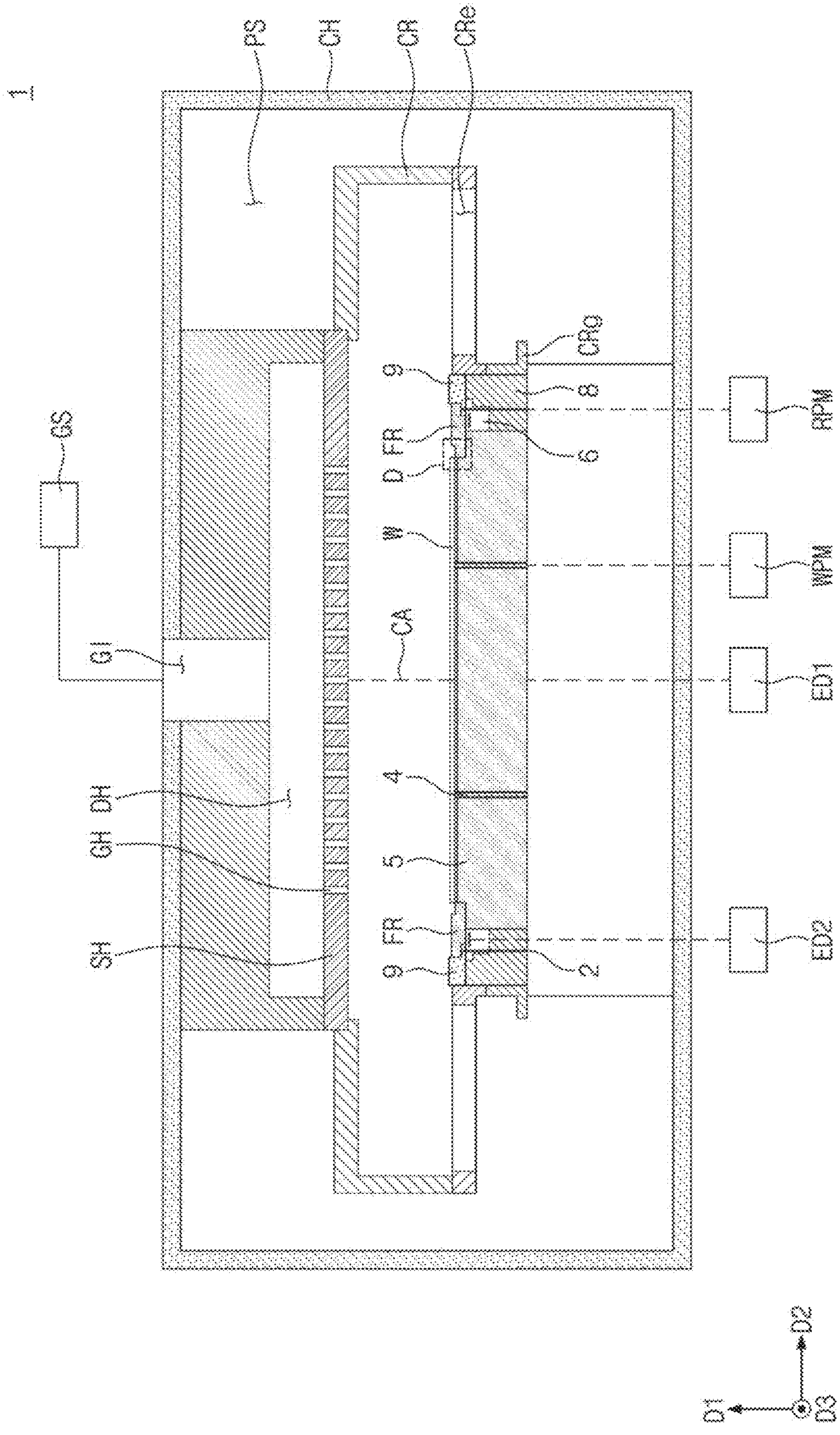
FIG. 11 is a cross-sectional view showing a substrate processing apparatus according to some embodiments of the disclosure.
Figure 12:
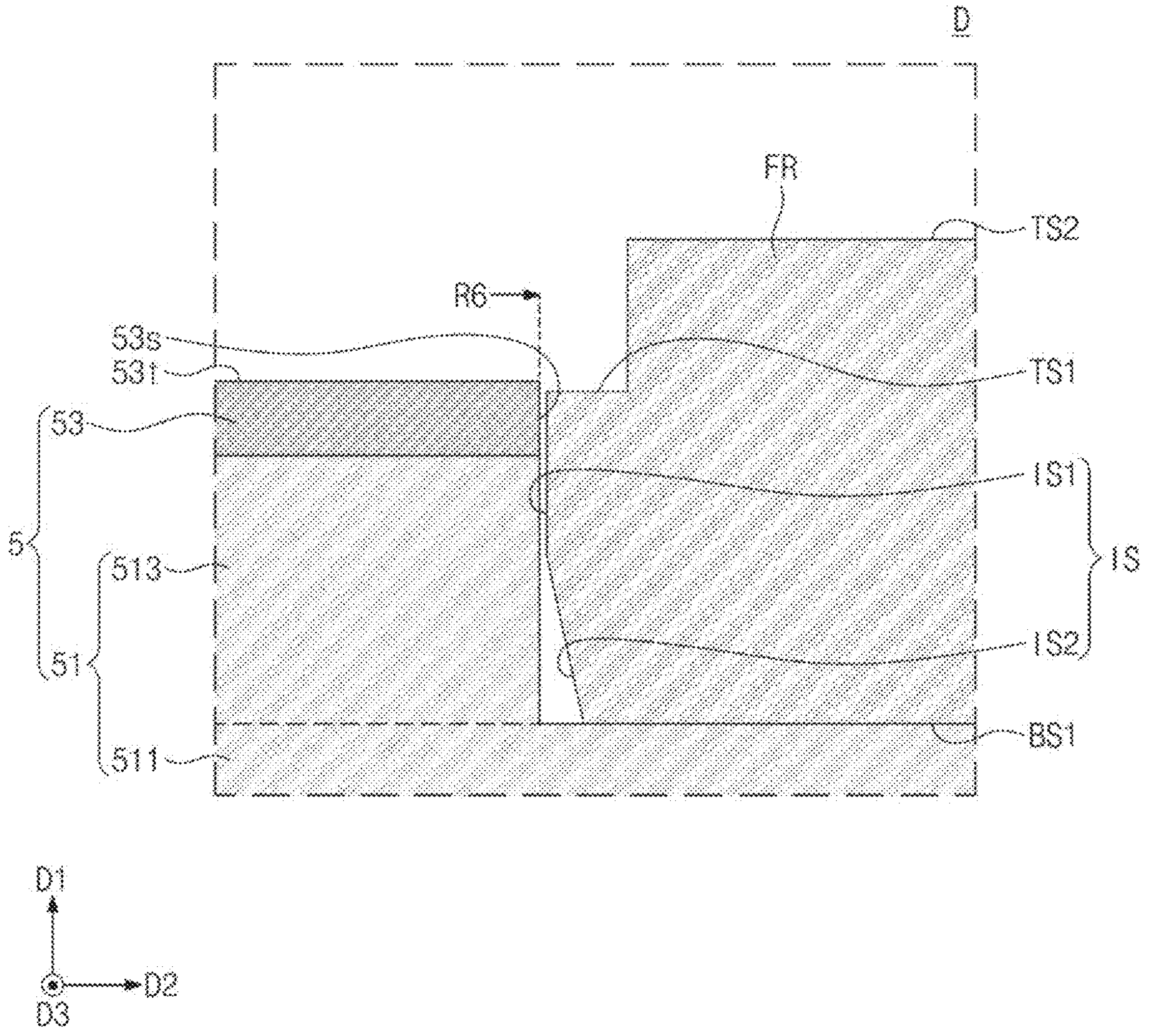
FIGS. 12, 13 and 14 are enlarged views of section D depicted in FIG. 11, showing an electrostatic chuck and a focus ring according to some embodiments of the disclosure.
Figure 13:
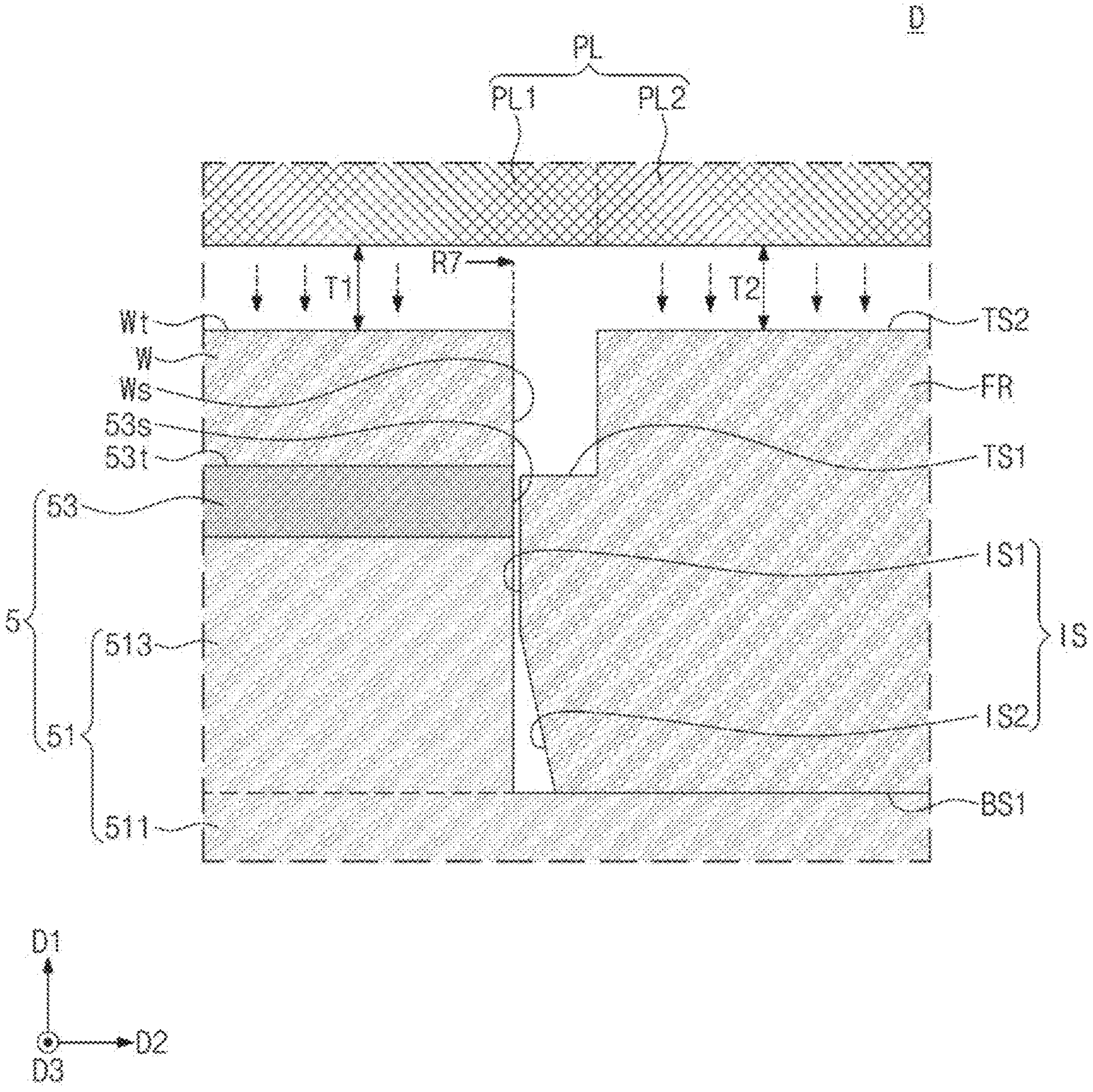
Figure 14:
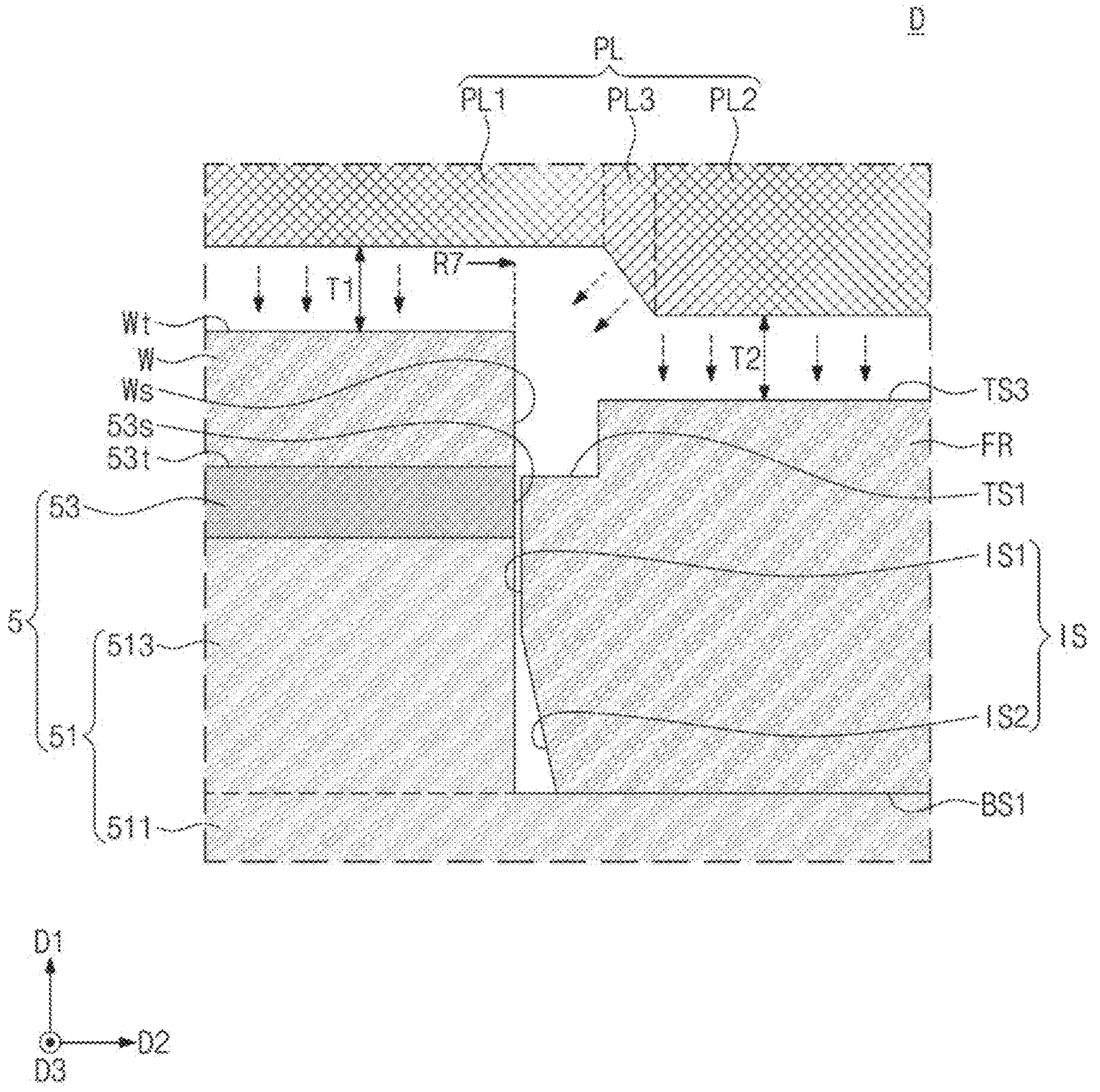

FIG. 11 is a cross-sectional view showing a substrate processing apparatus according to some embodiments of the disclosure. FIGS. 12, 13 and 14 are enlarged views of section D depicted in FIG. 11, showing an electrostatic chuck and a focus ring according to some embodiments of the disclosure.

Referring to FIG. 11, a substrate processing apparatus 1 may be provided. A substrate W may be located in the substrate processing apparatus 1. The substrate W may be positioned on and fixed to an electrostatic chuck structure 5. The electrostatic chuck structure 5 may have a different diameter from that of the electrostatic chuck structure 5 depicted in FIG. 1. Other configuration except the electrostatic chuck structure 5 may be substantially the same as those described in FIG. 1.

FIG. 12 shows a state before the substrate W of FIG. 11 is positioned on the electrostatic chuck structure 5. The electrostatic chuck structure 5 may include a plasma electrode 51 and a chuck 53 on the plasma electrode 51. The plasma electrode 51 may include an electrode body 511 and a plateau 513 on the electrode body 511. The electrode body 511, the plateau 513, and the chuck 53 of the electrostatic chuck structure 5 may have their functions substantially the same as those described in FIG. 2. For example, the plasma electrode 51 may be a lower electrode of the substrate processing apparatus 1. The chuck 53 may use an electrostatic force to fix the substrate W.

The electrostatic chuck structure 5 and the chuck 53 may each have a cylindrical shape. The chuck 53 may have a circular shape in a plan view. A distance between a central axis CA and a lateral surface 53*s* of the chuck 53 may be a radius R6 of the chuck 53. A diameter of the chuck 53 may indicate a distance between the lateral surface 53*s* of the chuck 53 and an opposite lateral surface 53*s* of the chuck 53, while passing through the central axis CA. The plateau 513 positioned below the chuck 53 may have a diameter substantially the same as that of the chuck 53. A lateral surface of the plateau 513 may be aligned with the lateral surface 53*s* of the chuck 53. For example, the chuck 53 may have a diameter of about 298.6 mm to about 300 mm.

A focus ring FR may be positioned on the electrode body 511 and the lateral surface 53*s* of the chuck 53. The focus ring FR may be spaced apart in a horizontal direction (e.g., the second direction D2) from the chuck 53. The focus ring FR may include a first top surface TS1 and a second top surface TS2 that are located at different levels. The focus ring FR may include a first inner lateral surface IS1 and a second inner lateral surface IS2 that make different angles with the first direction D1. The first inner lateral surface IS1 may contact the first top surface TS1 and be parallel to the first direction D1. The second inner lateral surface IS2 may downwardly extend and may not be parallel to the first direction D1. The second inner lateral surface IS2 may make an acute angle with the first direction D1. For example, the focus ring FR may have a shape substantially the same as or similar to that described in FIGS. 5 to 8.

FIG. 13 shows a state where the substrate W is positioned on the electrostatic chuck structure 5 and plasma PL is formed in the substrate processing apparatus 1. An edge region of the substrate W is shown. In a plan view, the edge region of the substrate W may surround or at least partially surround a central region of the substrate W. The focus ring FR may be in an initial state before a semiconductor process is performed.

The substrate W may be positioned on a top surface 53*t* of the chuck 53 and contact the chuck 53. The substrate W may have a circular shape in a plan view. A distance between the central axis CA and a lateral surface Ws of the substrate W may be a radius R7 of the substrate W. The radius R7 of the substrate W may be the same as the radius R6 of the chuck 53. For example, a diameter of the substrate W may be substantially the same as that of the chuck 53. Thus, the lateral surface Ws of the substrate W may be aligned with the lateral surface 53*s* of the chuck 53. As the substrate W does not allow the top surface 53*t* of the chuck 53 to be exposed to the plasma PL, the chuck 53 may be prevented from being damaged due to the plasma PL.

According to some embodiments, the diameter of the substrate W may be greater than that of the chuck 53. For example, a difference in diameter between the substrate W and the chuck 53 may be equal to or smaller than about 1.4 mm Even in this case, as the substrate W completely covers the top surface 53*t* of the chuck 53, the chuck 53 may be prevented from being damaged due to the plasma PL.

The plasma PL may be formed on the substrate W and the focus ring FR. The plasma PL may be formed from a process gas and an electric field generated from a first RF power supply ED1 of FIG. 11. A plasma sheath on the substrate W may have a first thickness T1. A plasma sheath on the focus ring FR may have a second thickness T2. The first thickness T1 and the second thickness T2 may be substantially the same as each other. In this description, the plasma sheath may be a region where the number of cations and neutrons is relatively greater than that of electrons.

A distance between a top surface Wt of the substrate W and plasma PL1 on the substrate W may be the first thickness T1 of the plasma sheath on the substrate W. A distance between the second top surface TS2 of the focus ring FR and plasma PL2 on the focus ring FR may be the second thickness T2 of the plasma sheath on the focus ring FR. For example, the distance between the top surface Wt of the substrate W and the plasma PL1 on the substrate W may be substantially the same as the distance between the second top surface TS2 of the focus ring FR and the plasma PL2 on the focus ring FR. In addition, the top surface Wt of the substrate W may be positioned on the same plane as that of the second top surface TS2 of the focus ring FR. Thus, the plasma PL may be formed having a constant level. For example, the plasma PL may be formed with no step difference.

The plasma PL1 on the substrate W may have a constant height in the first direction D1. Therefore, ions present in the plasma PL1 on the substrate W may move parallel to the first direction D1 onto the substrate W. The plasma PL2 on the focus ring FR may have a constant height in the first direction D1, and thus ions present in the plasma PL2 on the focus ring FR may move parallel to the first direction D1 onto the focus ring FR.

FIG. 14 shows a state where the substrate W is positioned on the electrostatic chuck structure 5 and the plasma PL is formed in the substrate processing apparatus 1. An edge region of the substrate W is shown. In a plan view, the edge region of the substrate W may surround or at least partially surround a central region of the substrate W. The focus ring FR may be in a state after a semiconductor process is performed several times. The semiconductor process may cause the focus ring FR to have an etched top surface. For example, the focus ring FR may have a third top surface TS3 that is formed when the plasma PL etches the second top surface TS2 of the focus ring FR depicted in FIG. 13. The third top surface TS3 of the focus ring FR may be located at a lower level than that of the second surface TS2 of the focus ring FR.

The plasma PL may be formed on the substrate W and the focus ring FR. A plasma sheath on the substrate W may have a first thickness T1. A plasma sheath on the focus ring FR may have a second thickness T2. The first thickness T1 and the second thickness T2 may be substantially the same as each other. A distance between a top surface Wt of the substrate W and plasma PL1 on the substrate W may be the first thickness T1 of the plasma sheath on the substrate W. A distance between the third top surface TS3 of the focus ring FR and plasma PL2 on the focus ring FR may be the second thickness T2 of the plasma sheath on the focus ring FR. For example, the distance between the top surface Wt of the substrate W and the plasma PL1 on the substrate W may be substantially the same as the distance between the third top surface TS3 of the focus ring FR and the plasma PL2 on the focus ring FR. In addition, the top surface Wt of the substrate W may be located at a higher level than that of the third top surface TS3 of the focus ring FR. The plasma PL1 on the substrate W may be located at a higher level than that of the plasma PL2 on the focus ring FR. For example, the plasma PL may have a step difference in the first direction D1.

As a semiconductor process is performed several times, a top surface of the focus ring FR may have a lowered level, and the top surface Wt of the substrate W may have a constant level. For example, as a semiconductor process is performed, a top surface of the focus ring FR may be lower than the top surface Wt of the substrate W. The plasma PL2 may be formed at a lowered position on the focus ring FR. For example, a height of the plasma PL1 on the substrate W is different from that of the plasma PL2 on the focus ring FR, inclined plasma PL3 may be formed between the plasma PL1 on the substrate W and the plasma PL2 on the focus ring FR. The inclined plasma PL3 may be spaced apart in the second direction D2 from the chuck 53. In a plan view, the inclined plasma PL3 may not overlap the chuck 53.

The inclined plasma PL3 may have a variable height in the first direction D1. The height in the first direction D1 of the inclined plasma PL3 may increase with decreasing distance from the substrate W. Thus, ions present in the inclined plasma PL3 may move at an angle relative to the first direction D1. In this case, ions present in the inclined plasma PL3 may move in an oblique direction.

The chuck 53 of the disclosure may have a diameter substantially the same as that of the substrate W, and the lateral surface 53*s* of the chuck 53 may be aligned with the lateral surface Ws of the substrate W. The inclined plasma PL3 may be positioned spaced apart in the second direction D2 from the chuck 53, and therefore may be positioned spaced apart in the second direction D2 from the substrate W. In a plan view, the inclined plasma PL3 may not overlap the substrate W. Thus, ions having oblique directions may not move onto the top surface Wt of the substrate W. For example, ions moving parallel to the first direction D1 may reach all of the edge and central regions of the substrate W. In this case, a semiconductor pattern on the edge region may be formed to have the same shape as that of a semiconductor pattern on the central region. Accordingly, there may be an improvement in distribution of semiconductor patterns in the substrate W.

In addition, a temperature control gas may be supplied from the electrostatic chuck structure 5 toward a gap between the top surface 53*t* of the chuck 53 and a bottom surface of the substrate W. The temperature control gas may be a medium through which a temperature of the electrostatic chuck structure 5 is transferred to the substrate W. For example, the temperature control gas may include helium (He). Because the chuck 53 of the disclosure has substantially the same diameter as that of the substrate W, the temperature control gas may reach even the edge region of the substrate W. Thus, a temperature of the edge region may be controlled. Accordingly, there may be an improvement in distribution of semiconductor patterns in the substrate W.

Figure 15:
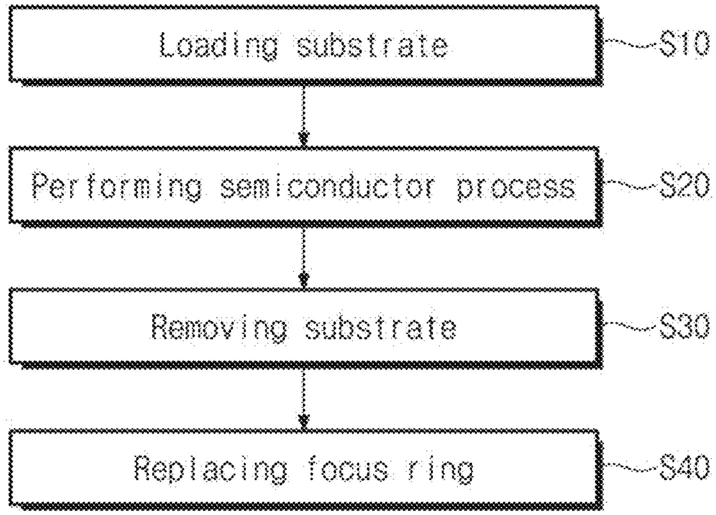
FIG. 15 is a flowchart showing a semiconductor fabrication method according to some embodiments of the disclosure.

FIG. 15 is a flowchart showing a semiconductor fabrication method according to some embodiments of the disclosure.

Referring to FIG. 15, a semiconductor fabrication method may be provided. The semiconductor fabrication method may refer to a method of fabricating a semiconductor device using the substrate processing apparatus 1 described in FIG. 1 and the focus ring FR described in FIGS. 1 to 10. The semiconductor fabrication method may include loading a substrate in operation S10, performing a semiconductor process in operation S20, removing a substrate in operation S30, and replacing a focus ring in operation S40. With reference to FIGS. 16 to 22, the following will describe in detail the semiconductor fabrication method of FIG. 15.

Figure 18:
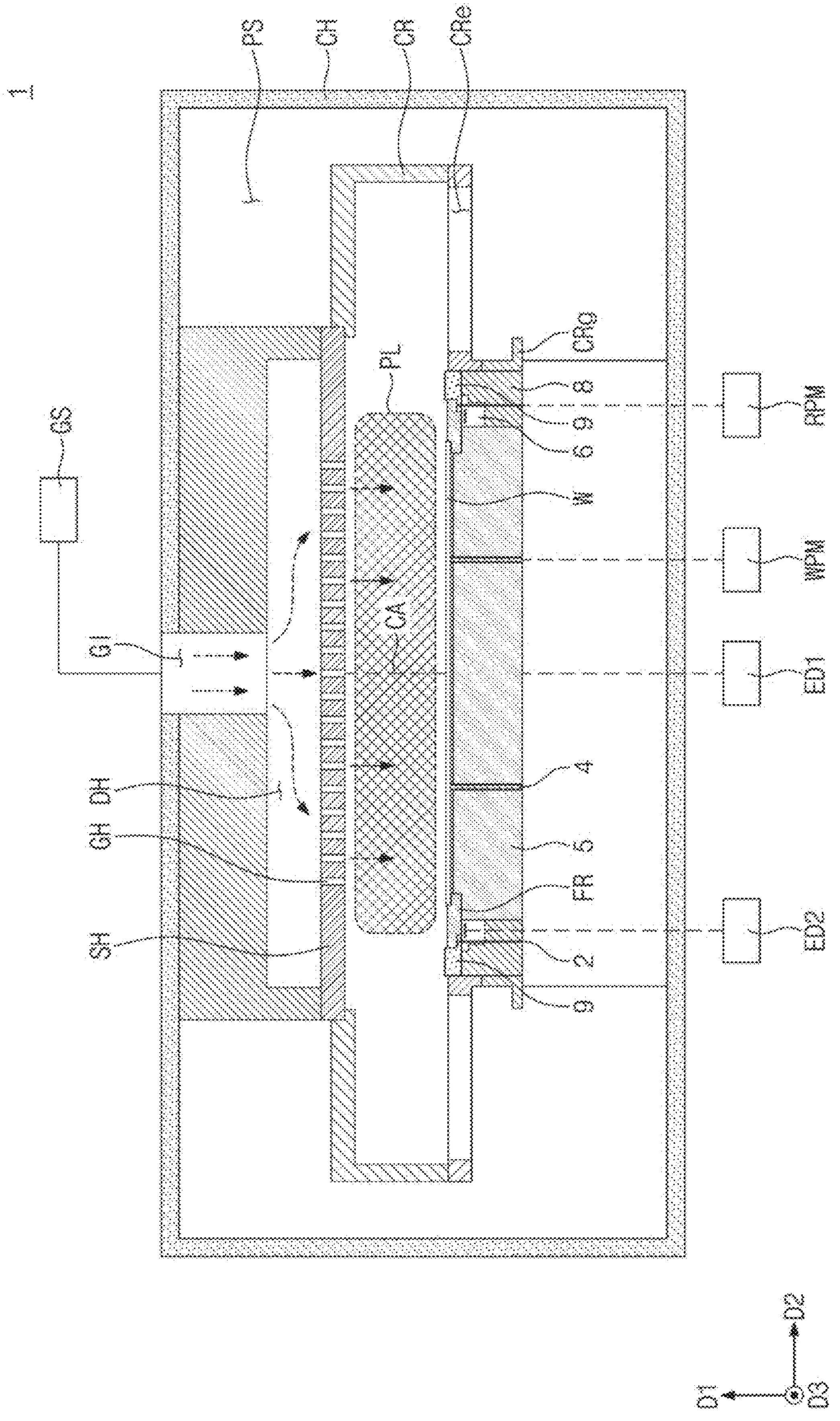
Figure 19:
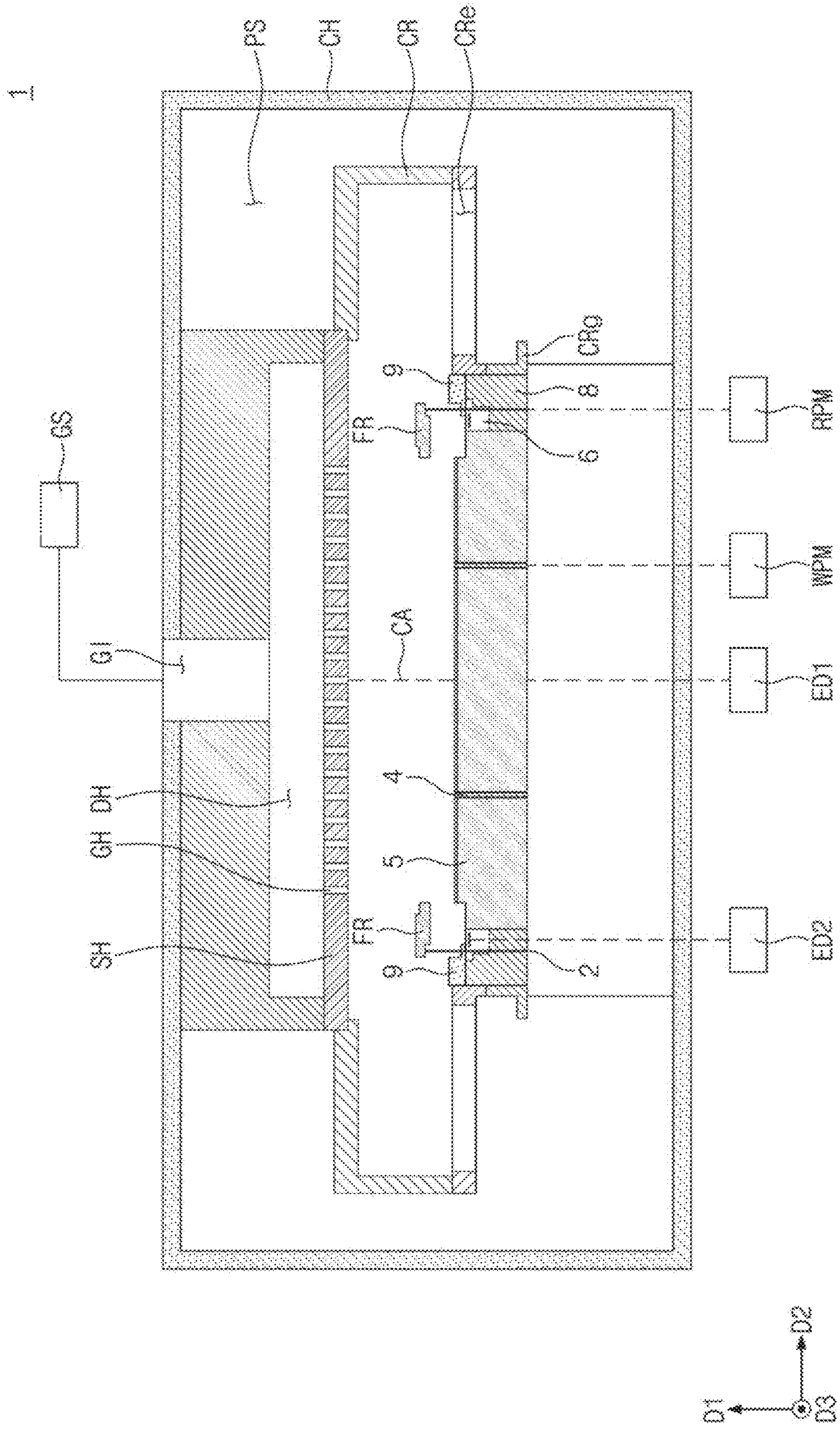
Figure 20:
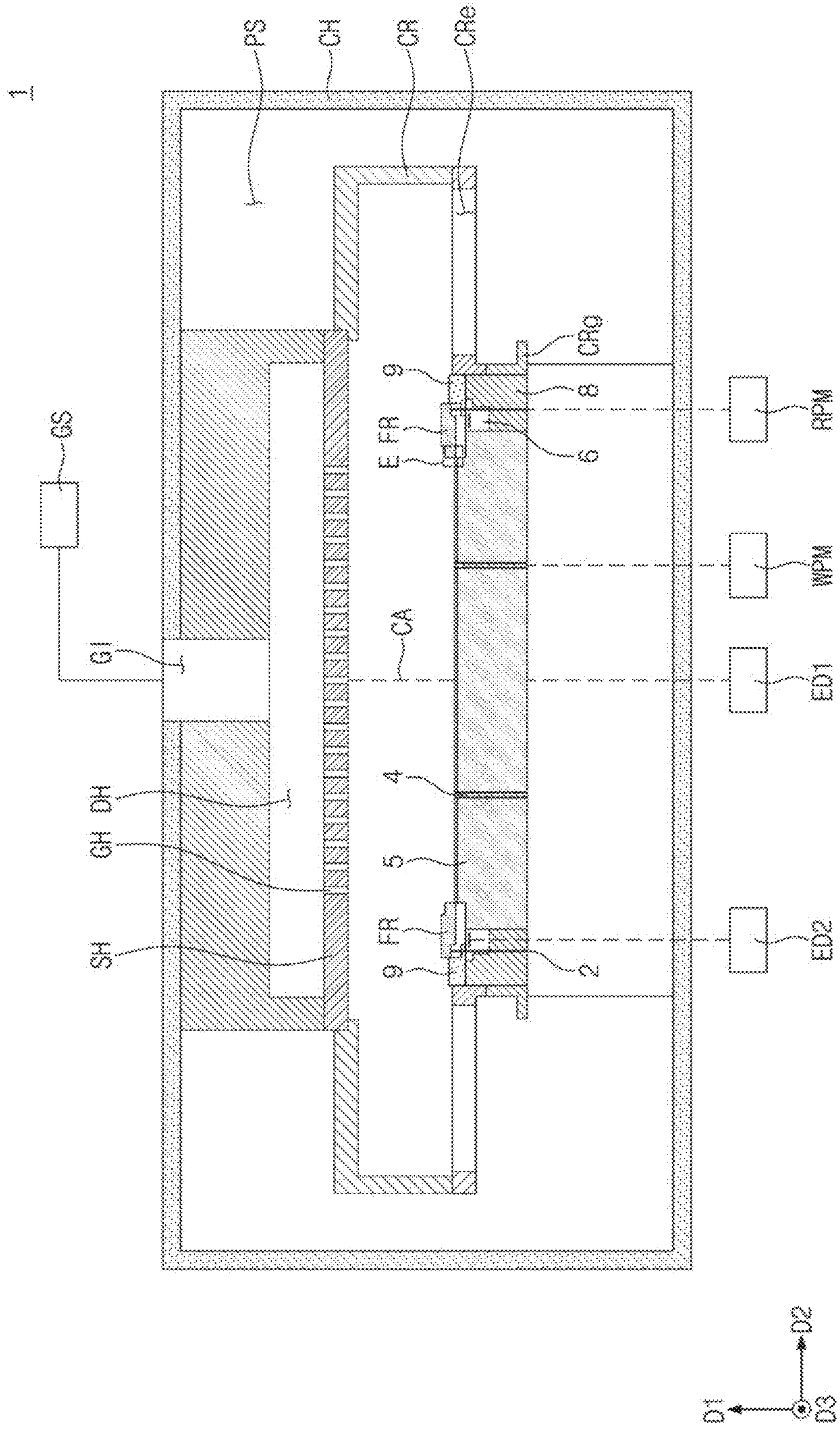
Figure 21:
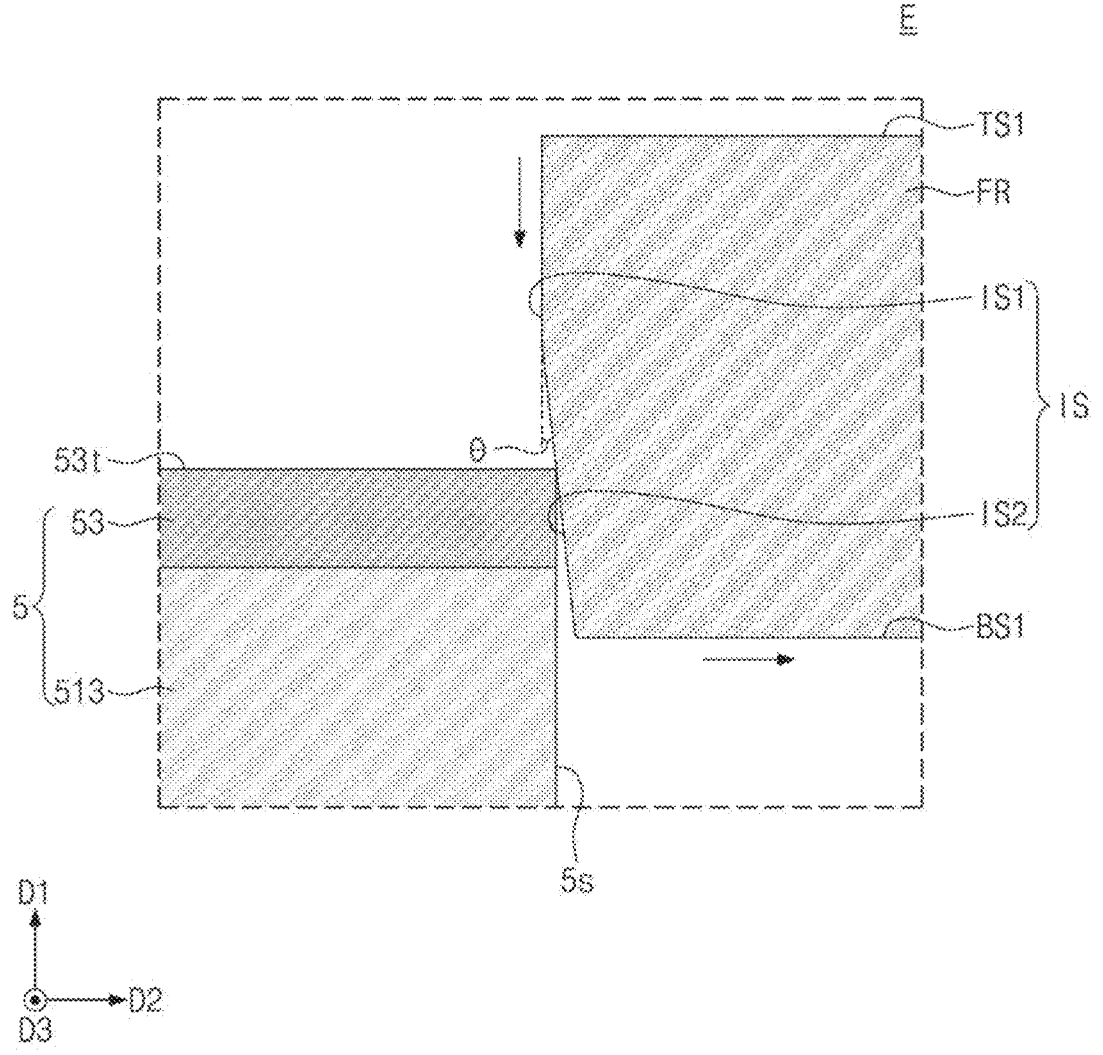
FIGS. 21 and 22 are enlarged views of section E depicted in FIG. 20, showing a focus ring according to some embodiments of the disclosure.
Figure 22:
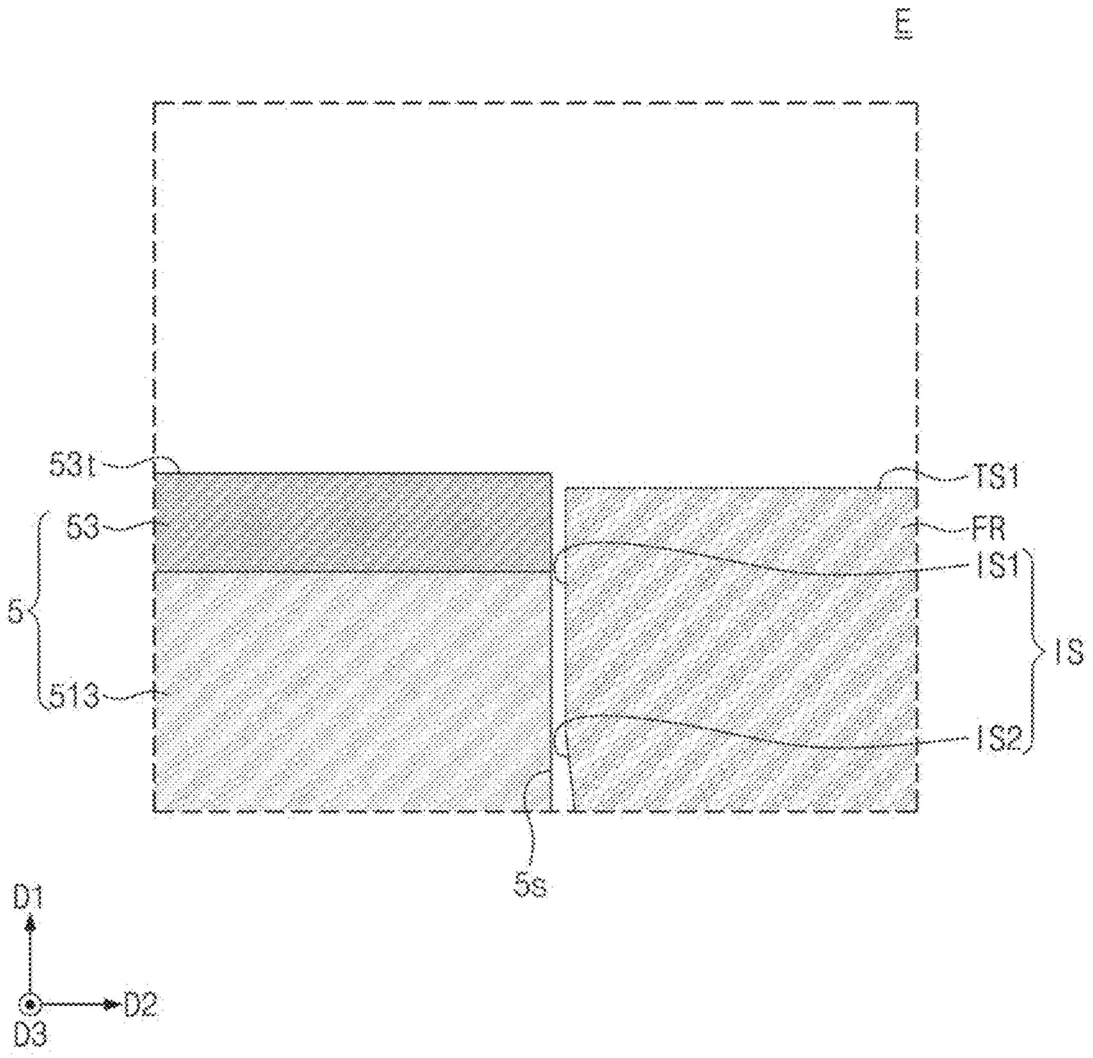

FIGS. 16, 17, 18, 19 and 20 are cross-sectional views showing the semiconductor fabrication method of FIG. 15 according to some embodiments of the disclosure. FIGS. 21 and 22 are enlarged views of section E depicted in FIG. 20, showing a focus ring according to some embodiments of the disclosure.

Figure 16:
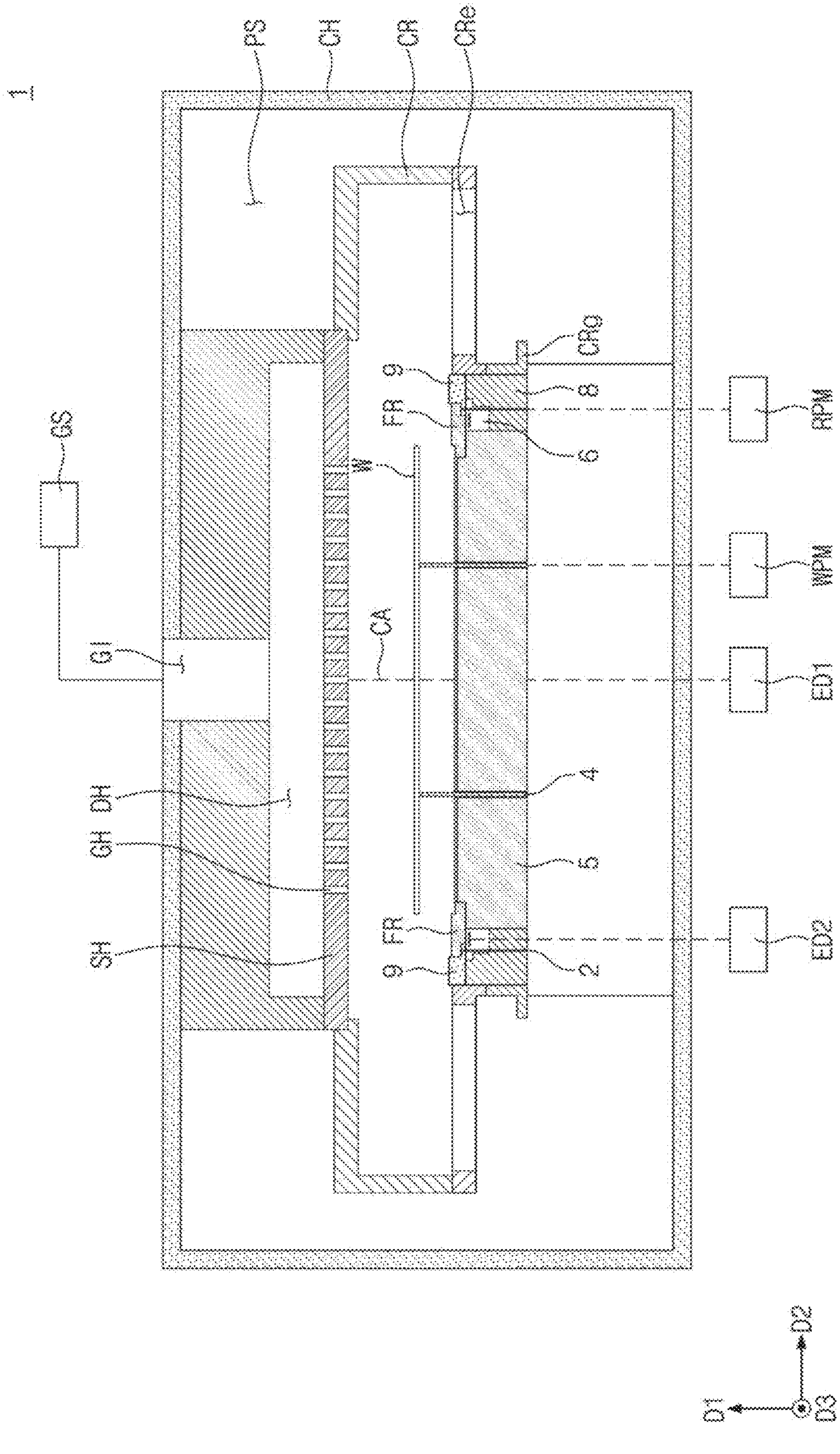
FIGS. 16, 17, 18, 19 and 20 are cross-sectional views showing the semiconductor fabrication method of FIG. 15 according to some embodiments of the disclosure.
Figure 17:
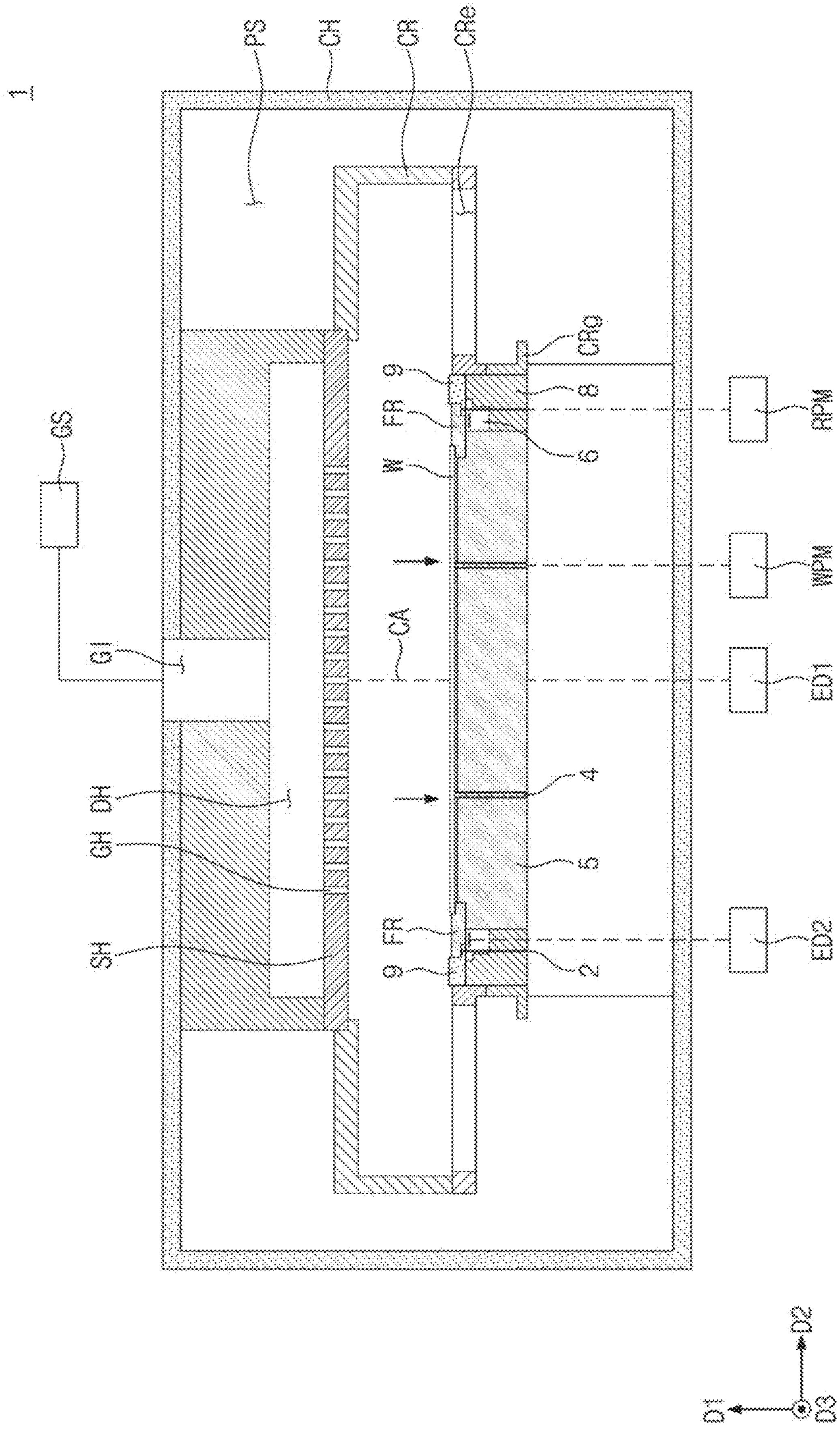

Referring to FIGS. 16 and 17, the substrate loading operation S10 may include placing the substrate W on the substrate lift pin 4 that is ascended (e.g., raised) by the substrate lift pin mechanism WPM, placing the substrate W on the electrostatic chuck structure 5 by allowing the substrate lift pin mechanism WPM to descend the substrate lift pin 4 (e.g., by lowering the substrate lift pin 4), and fixing the substrate W onto the electrostatic chuck structure 5. The substrate W may include a silicon (Si) wafer, but the disclosure is not limited thereto.

For example, a robot arm or so forth may introduce the substrate W into the process chamber CH. When the robot arm introduces the substrate W into the process chamber CH, the substrate lift pin mechanism WPM may drive the substrate lift pin 4 to ascend in the first direction D1. For example, the substrate lift pin 4 may ascend to contact a bottom surface of the substrate W, and the substrate W may also ascend in the first direction D1. The substrate W may be disposed on the elevated substrate lift pin 4, and the substrate W and the robot arm may be spaced apart from each other. Afterwards, the robot arm may be removed from an inside of the process chamber CH.

The substrate lift pin mechanism WPM may drive the substrate lift pin 4 to descend in the first direction D1. Therefore, the substrate W may descend in the first direction D1, and may be disposed on the electrostatic chuck structure 5. When the substrate W is disposed on the electrostatic chuck structure 5, the chuck (see 53 of FIG. 2) of the electrostatic chuck structure 5 may fix the substrate W by using an electrostatic force provided from a chuck electrode.

The substrate loading step S10 may include allowing a lateral surface of the electrostatic chuck structure 5 to align with that of the substrate W. Referring to FIGS. 11 to 14, the chuck 53 of the electrostatic chuck structure 5 may have a diameter substantially the same as that of the substrate W. Thus, when the substrate W is positioned on the chuck 53 of the electrostatic chuck structure 5, a lateral surface Ws of the substrate W may be aligned with a lateral surface 53*s* of the chuck 53.

Referring to FIG. 18, the semiconductor process operation S20 may include supplying the process chamber CH with a process gas, supplying the plasma electrode (see 51 of FIG. 2) with a first RF power, and supplying the outer electrode (see 7 of FIG. 2) with a second RF power.

The supplying of the process gas to the process chamber CH may include allowing the gas supply GS to supply the process chamber CH with a process gas (i.e., supplying the process chamber CH with a process gas). The process gas may move to the substrate W through the gas inlet GI, the distribution space DH, and the distribution holes GH of the showerhead SH. After that, the process gas may pass through the slit CRe of the confinement ring CR to move down in the process chamber CH, thereby being outwardly discharged. In a plan view, the distribution holes GH of the showerhead SH may be two-dimensionally arranged. Thus, the process may be uniformly supplied on the substrate W.

The supplying of the first RF power to the plasma electrode 51 may be performed by the first RF power supply ED1. The plasma electrode 51 to which the first RF power is applied may form an electric field in a space on the substrate W. The electric field and the process gas may form plasma PL in a space on the substrate W. For example, the semiconductor process may be a semiconductor process using the plasma PL, for example, an etching process using the plasma PL. Thus, the plasma PL may partially etch a top surface of the substrate W.

The supplying of the second RF power to the outer electrode 7 may be performed by the second RF power supply ED2. The second RF power may be differentiated from the first RF power. The first RF power may have a frequency of about 60 MHz, and the second RF power may have a frequency of about 400 kHz, but the disclosure is not limited thereto. The second RF power applied to the outer electrode 7 may form an electric field in a space on the outer electrode 7. Thus, the behavior of the plasma PL formed in a space on the outer electrode 7 may be controlled. Accordingly, there may be a reduced or no difference between central and edge portions of the substrate W.

Referring back to FIG. 16, the substrate removal operation S30 may include removing the electrostatic force that fixes the substrate W and transferring the substrate W from the process chamber CH.

For example, the electrostatic force may be removed to eliminate an adhesive force between the electrostatic chuck structure 5 and the substrate W. Thereafter, the substrate lift pin mechanism WPM may drive the substrate lift pin 4 to ascend in the first direction D1 to separate the substrate W and the electrostatic chuck structure 5 from each other. The robot arm may transfer the elevated substrate W from the process chamber CH. For example, the substrate removal operation S30 may be performed in an order opposite to that of the substrate loading operation S10.

Referring to FIGS. 19 and 20, the replacement operation S40 may include ascending the focus ring FR, outwardly transferring the focus ring FR from the process chamber CH, inwardly transferring a new focus ring FR into the process chamber CH, and descending the focus ring FR.

The ascending of the focus ring FR may be performed by the ring lift pin 2 and the ring lift pin mechanism RPM. For example, the ring lift pin mechanism RPM may drive the ring lift pin 2 to ascend in the first direction D1. As described in FIG. 2, the ring lift pin 2 may contact the second bottom surface BS2 of the focus ring FR. Thus, the ring lift pin 2 may ascend and lift the focus ring FR to outwardly expose a lateral surface of the electrostatic chuck structure 5, a top surface of the coupling ring 6, and a lateral surface of the outer ring 9.

The outward transferring of the focus ring FR from the process chamber CH may be performed by a robot arm. For example, when the robot arm is introduced into the process chamber CH, the ring lift pin mechanism RPM may drive the ring lift pin 2 to descend in the first direction D1. Thus, the focus ring FR may be positioned on the robot arm. Afterwards, the robot arm may outwardly transfer the focus ring FR from the process chamber CH.

The inward transferring of the focus ring FR into the process chamber CH may be performed by a robot arm. For example, a new focus ring FR may be positioned on the robot arm outside the process chamber CH. After that, the robot arm may inwardly transfer the new focus ring FR into the process chamber CH. The ring lift pin mechanism RPM may drive the ring lift pin 2 to ascend in the first direction D1. Thus, the new focus ring FR may ascend in the first direction D1 while contacting the ring lift pin 2. For example, the new focus ring FR may be spaced apart from the robot arm. Thereafter, the robot arm may be removed from an inside of the process chamber CH.

The outward transferring of the focus ring FR from the process chamber CH and the inward transferring of the focus ring FR into the process chamber CH may be respectively similar to the substrate removal operation S30 and the substrate loading operation S10.

Referring to FIGS. 20 to 22, the descending of the focus ring FR may include allowing at least a portion of the second inner lateral surface IS2 of the focus ring FR to contact the electrostatic chuck structure 5 (i.e., contacting the focus ring FR and the at least a portion of the second inner lateral surface IS2), and allowing the center of the electrostatic chuck structure 5 and the central axis CA of the focus ring FR to align with each other (i.e., aligning the central axis CA of the focus ring FR to the center of the electrostatic chuck structure 5).

For example, the focus ring FR may be positioned on the ring lift pin 2. The ring lift pin mechanism RPM may drive the ring lift pin 2 to descend in the first direction D1. Thus, the focus ring FR may descend in the first direction D1. While the focus ring FR descends in the first direction D1, the first bottom surface BS1 may be located at a lower level than that of the top surface 53*t* of the chuck 53. In this case, the focus ring FR may have a central axis CA that is not aligned with the center of the electrostatic chuck structure 5. For example, in a plan view, a distance between an inner lateral surface IS of the focus ring FR and the lateral surface 5*s* of the electrostatic chuck structure 5 may not be constant in all directions. Therefore, while the focus ring FR descends in the first direction D1, at least a portion of the inner lateral surface IS may contact the electrostatic chuck structure 5. For example, when the focus ring FR descends in the first direction D1, at least a portion of a second inner lateral surface IS2 may contact the electrostatic chuck structure 5.

The second inner lateral surface IS2 may not be parallel to the first direction D1. An angle θ may be provided between the second inner lateral surface IS2 and the first direction D1. An acute angle may be given as the angle θ between the second inner lateral surface IS2 and the first direction D1. For example, the second inner lateral surface IS2 may be an inclined surface with respect to the first direction D1. Thus, when the second inner lateral surface IS2 of the focus ring FR descends while contacting the electrostatic chuck structure 5, the focus ring FR may move in a second direction D2 or its opposite direction. For example, the focus ring FR moves in the second direction D2 or its opposite direction until the second inner lateral surface IS2 is lower than the top surface 53*t* of the chuck 53. Accordingly, the central axis CA of the focus ring FR and the center of the electrostatic chuck structure 5 may be aligned with each other while the focus ring FR moves in the second direction D2 or its opposite direction.

Afterwards, the focus ring FR may descend until the first top surface TS1 of the focus ring FR is located at a lower level than that of the top surface 53*t* of the chuck 53. For example, when the replacement operation S40 is completed, the first top surface TS1 of the focus ring FR may be located at a lower level than that of the top surface 53*t* of the chuck 53.

According to some embodiments, the focus ring FR may be configured to include a plurality of members. For example, the focus ring FR may include a first ring and a second ring. In this case, the replacement operation S40 may include replacing an entirety of the focus ring FR or a portion of the focus ring FR.

According to some embodiments, the replacement operation S40 may be performed after a multiple repetition of performance of the substrate loading operation S10, the semiconductor process operation S20, and the substrate removal operation S30. For example, a semiconductor process may be performed on a plurality of substrates W, and then the focus ring FR may be replaced.

According to the disclosure, while the focus ring FR descends, the central axis CA of the focus ring FR and the center of the electrostatic chuck structure 5 may be automatically aligned with each other. For example, no assistant tool may be required in a procedure for installing the focus ring FR into the substrate processing apparatus 1. The focus ring FR and the electrostatic chuck structure 5 may be aligned with each other at a constant interval in all directions. Therefore, the focus ring FR may be replaced by using only the ring lift pin 2, the ring lift pin mechanism RPM, and the robot arm. For example, because only the focus ring FR is replaced while the process chamber CH maintains an internal environment thereof, a backup time of the substrate processing apparatus 1 may be reduced to increase a yield.

In addition, because the focus ring FR and the electrostatic chuck structure 5 are automatically aligned with each other, the substrate W may be automatically aligned on the electrostatic chuck structure 5. For example, even when the chuck 53 has substantially the same diameter as that of the substrate W, the substrate W may completely cover the top surface 53*t* of the chuck 53. Therefore, substantially the same effect as that described in FIGS. 13 and 14 may be obtained to improve distribution in the substrate W.

According to a focus ring of the disclosure, a substrate processing apparatus including the same, and a semiconductor fabrication method using the same, the focus ring may have a top surface having a first inner diameter and a bottom surface having a second inner diameter. The first inner diameter may be smaller than the second inner diameter, and thus the top surface of the focus ring may be closer than the bottom surface of the focus ring to an electrostatic chuck structure. Thus, a central axis of the focus ring may be aligned with that of the electrostatic chuck structure. Accordingly, a spacing between the focus ring and the electrostatic chuck structure may be uniform in all direction.

According to a focus ring of the disclosure, a substrate processing apparatus including the same, and a semiconductor fabrication method using the same, as a spacing between the focus ring and an electrostatic chuck structure is uniform in all direction, a substrate may be accurately positioned on the electrostatic chuck structure. Thus, the electrostatic chuck structure may have the same diameter as that of the substrate, and a central region and an edge region of the substrate may undergo a semiconductor process at the same condition. Accordingly, there may be an improvement in distribution in the substrate.

According to a focus ring of the disclosure, a substrate processing apparatus including the same, and a semiconductor fabrication method using the same, the focus ring may have an inner lateral surface including a first inner lateral surface and a second inner lateral surface. The first inner lateral surface may be parallel to a vertical direction. The second inner lateral surface may downwardly extend and make an acute angle with the vertical direction. Thus, it an arcing phenomenon of the focus ring and accidents including injury to workers may be prevented. In addition, a spare space may be provided between an electrostatic chuck structure and a lower portion of the focus ring.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A substrate processing apparatus, comprising:

a focus ring, wherein the focus ring comprises:

a central axis that extends in a first direction;

a top surface having a first inner diameter;

a bottom surface having a second inner diameter that is greater than the first inner diameter;

an inner lateral surface between the top surface and the bottom surface, the inner lateral surface comprising a first inner lateral surface and a second inner lateral surface; and an outer lateral surface comprising a first outer lateral surface and a second outer lateral surface that extends downward in the first direction from a bottom of the first outer lateral surface, wherein the second inner lateral surface extends downward from the first inner lateral surface, wherein a first angle between the first inner lateral surface and a line corresponding to the first direction is different from a second angle between the second inner lateral surface and the line corresponding to the first direction, wherein the first outer lateral surface is parallel to the first direction, and wherein a third angle between the second outer lateral surface and the line corresponding to the first direction is an acute angle.

2. The substrate processing apparatus of claim 1, wherein the first inner lateral surface is parallel to the first direction, and wherein the second angle between the second inner lateral surface and the line corresponding to the first direction is an acute angle.

3. The substrate processing apparatus of claim 2, the second angle is greater than about 0° and equal to or smaller than about 5°.

4. The substrate processing apparatus of claim 1, wherein the first inner lateral surface has a shape that is convex toward the central axis.

5. The substrate processing apparatus of claim 1, wherein the inner lateral surface of the focus ring further comprises a third inner lateral surface, and wherein the third inner lateral surface is between the first inner lateral surface and the second inner lateral surface.

6. The substrate processing apparatus of claim 1, wherein a difference between the first inner diameter and the second inner diameter is in a range of about 0.01 mm to about 0.5 mm.

7. A substrate processing apparatus, comprising:

an electrostatic chuck structure comprising a chuck that supports a substrate; and a focus ring on a lateral surface of the chuck and having a central axis that extends in a first direction, wherein the focus ring comprises a first outer lateral surface and a second outer lateral surface that extends downward in the first direction from a bottom of the first outer lateral surface, wherein the first outer lateral surface is parallel to the first direction, wherein an angle between the second outer lateral surface and a line corresponding to the first direction is an acute angle, wherein a top surface of the focus ring has a first inner diameter, wherein a bottom surface of the focus ring has a second inner diameter, wherein the first inner diameter is smaller than the second inner diameter, and wherein a diameter of the chuck is in a range of about 298.6 mm to about 300 mm.

8. The substrate processing apparatus of claim 7, wherein the top surface of the focus ring is at a level lower than a level of a top surface of the chuck.

9. The substrate processing apparatus of claim 7, wherein the focus ring comprises:

a first inner lateral surface between the top surface and the bottom surface; and a second inner lateral surface that extends from the first inner lateral surface, and wherein a first angle between the first inner lateral surface and the line corresponding to the first direction is different from a second angle between the second inner lateral surface and the line corresponding to the first direction.

10. The substrate processing apparatus of claim 9, wherein the focus ring further comprises a third inner lateral surface between the first inner lateral surface and the second inner lateral surface, wherein at least one of the first inner lateral surface, the second inner lateral surface, and the third inner lateral surface has a shape that is convex toward the central axis.

11. A substrate processing apparatus, comprising:

an electrostatic chuck structure;

a focus ring on the electrostatic chuck structure and having a central axis that extends in a first direction; and an outer ring that at least partially surrounds the focus ring, wherein an inner lateral surface of the focus ring comprises a first inner lateral surface and a second inner lateral surface, wherein an outer lateral surface of the focus ring comprises a first outer lateral surface and a second outer lateral surface, wherein the second inner lateral surface contacts the first inner lateral surface, wherein the first inner lateral surface is closer to the electrostatic chuck structure than the second inner lateral surface, wherein the second outer lateral surface extends downward in the first direction from a bottom of the first outer lateral surface, and wherein the first outer lateral surface is closer to the outer ring than the second outer lateral surface.

12. The substrate processing apparatus of claim 11, wherein a first angle between the first inner lateral surface and a line corresponding to the first direction is different from a second angle between the second inner lateral surface and the line corresponding to the first direction.

13. The substrate processing apparatus of claim 11, wherein a top surface of the focus ring has a first inner diameter, wherein a bottom surface of the focus ring has a second inner diameter, and wherein the first inner diameter is smaller than the second inner diameter.

14. The substrate processing apparatus of claim 11, wherein the first inner lateral surface is parallel to the first direction, and wherein the second inner lateral surface forms an acute angle with a line corresponding to the first direction.

15. The substrate processing apparatus of claim 11, wherein the inner lateral surface of the focus ring further comprises a third inner lateral surface, and wherein the third inner lateral surface is between the first inner lateral surface and the second inner lateral surface.

16. The substrate processing apparatus of claim 15, wherein at least one of the first inner lateral surface, the second inner lateral surface, and the third inner lateral surface has a shape that is convex toward the electrostatic chuck structure.

17. The substrate processing apparatus of claim 15, wherein the first inner lateral surface and the second inner lateral surface are parallel to the first direction.

18. The substrate processing apparatus of claim 11, further comprising a ring lift pin extending in the first direction, wherein the ring lift pin is below the focus ring.

19. The substrate processing apparatus of claim 11, further comprising:

a power supply connected to the electrostatic chuck structure;

a showerhead on the electrostatic chuck structure; and a confinement ring between the electrostatic chuck structure and the showerhead.

* * * * *